(12) United States Patent
Cheng et al.

(10) Patent No.: US 8,530,971 B2
(45) Date of Patent: Sep. 10, 2013

(54) BORDERLESS CONTACTS FOR SEMICONDUCTOR DEVICES

(75) Inventors: Kangguo Cheng, Guilderland, NY (US); Bruce B. Doris, Brewster, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/617,084

(22) Filed: Nov. 12, 2009

(65) Prior Publication Data

US 2011/0108930 A1 May 12, 2011

(51) Int. Cl.
*H01L 21/00* (2006.01)

(52) U.S. Cl.
USPC ........................................... 257/365; 257/368

(58) Field of Classification Search
USPC .................... 438/585–595; 257/365–368
See application file for complete search history.

(56) References Cited

U.S. PATENT DOCUMENTS

| | | | | |
|---|---|---|---|---|
| 4,944,682 | A | 7/1990 | Cronin et al. | 437/192 |
| 4,966,870 | A | 10/1990 | Barber et al. | 437/228 |
| 5,102,815 | A * | 4/1992 | Sanchez | 438/305 |
| 5,651,857 | A | 7/1997 | Cronin et al. | 156/644.1 |
| 5,759,867 | A | 6/1998 | Armacost et al. | 437/195 |
| 5,965,462 | A | 10/1999 | Tan et al. | 438/719 |
| 5,966,597 | A | 10/1999 | Wright | 438/197 |
| 6,013,553 | A * | 1/2000 | Wallace et al. | 438/287 |
| 6,037,223 | A * | 3/2000 | Su et al. | 438/257 |
| 6,096,595 | A * | 8/2000 | Huang | 438/238 |
| 6,103,608 | A * | 8/2000 | Jen et al. | 438/592 |
| 6,130,121 | A | 10/2000 | Sze | 438/167 |
| 6,194,748 | B1 * | 2/2001 | Yu | 257/216 |
| 6,207,514 | B1 * | 3/2001 | Furukawa et al. | 438/299 |
| 6,228,731 | B1 | 5/2001 | Liaw et al. | 438/303 |
| 6,235,593 | B1 | 5/2001 | Huang | 438/279 |
| 6,235,627 | B1 | 5/2001 | Nakajima | 438/638 |
| 6,236,094 | B1 | 5/2001 | Wright | 257/413 |
| 6,255,205 | B1 * | 7/2001 | Sung | 438/595 |
| 6,261,911 | B1 | 7/2001 | Lee et al. | 438/300 |
| 6,265,271 | B1 | 7/2001 | Thei et al. | 438/296 |
| 6,274,468 | B1 | 8/2001 | Hsu | 438/586 |
| 6,335,279 | B2 | 1/2002 | Jung et al. | 438/666 |

(Continued)

FOREIGN PATENT DOCUMENTS

EP 0 967 640 A2 12/1999
KR 20020003893 A1 1/2002

OTHER PUBLICATIONS

"Formation of a Thermally Stable NiSi FUSI Gate Electrode by a Novel Integration Process", S.Y. Tan et al., Mater.Res.Soc.Symp. Proc., vol. 958, 2007, 7 pgs.

*Primary Examiner* — Richard Booth
(74) *Attorney, Agent, or Firm* — Harrington & Smith; Louis J. Percello

(57) ABSTRACT

In one exemplary embodiment of the invention, a method (e.g., to fabricate a semiconductor device having a borderless contact) including: forming a first gate structure on a substrate; depositing an interlevel dielectric over the first gate structure; planarizing the interlevel dielectric to expose a top surface of the first gate structure; removing at least a portion of the first gate structure; forming a second gate structure in place of the first gate structure; forming a contact area for the borderless contact by removing a portion of the interlevel dielectric; and forming the borderless contact by filling the contact area with a metal-containing material.

10 Claims, 21 Drawing Sheets

(56) References Cited

U.S. PATENT DOCUMENTS

| | | | |
|---|---|---|---|
| 6,380,063 B1 | 4/2002 | Chediak et al. | 438/621 |
| 6,403,423 B1 | 6/2002 | Weybright et al. | 438/279 |
| 6,406,987 B1 | 6/2002 | Huang | 438/595 |
| 6,466,656 B1 | 10/2002 | Evans et al. | 379/93.07 |
| 6,501,131 B1 | 12/2002 | Divakaruni et al. | 257/344 |
| 6,531,724 B1 | 3/2003 | Furukawa et al. | 257/288 |
| 6,541,810 B2 | 4/2003 | Divakaruni et al. | 257/302 |
| 6,548,357 B2 | 4/2003 | Weybright et al. | 438/279 |
| 6,613,637 B1 | 9/2003 | Lee et al. | 438/301 |
| 6,696,333 B1 * | 2/2004 | Zheng et al. | 438/230 |
| 6,709,926 B2 | 3/2004 | Chidambarrao et al. | 438/258 |
| 6,720,213 B1 | 4/2004 | Gambino et al. | 438/184 |
| 6,724,051 B1 | 4/2004 | Woo et al. | 257/382 |
| 6,791,190 B1 | 9/2004 | Chung | 257/773 |
| 6,798,017 B2 | 9/2004 | Furukawa et al. | 257/329 |
| 6,812,092 B2 | 11/2004 | Seitz et al. | 438/243 |
| 6,873,010 B2 | 3/2005 | Chidambarrao et al. | 257/329 |
| 7,037,774 B1 | 5/2006 | Syau | 438/230 |
| 7,053,444 B2 * | 5/2006 | Prall et al. | 257/316 |
| 7,074,666 B2 | 7/2006 | Furukawa et al. | 438/238 |
| 7,138,685 B2 | 11/2006 | Hsu et al. | 257/368 |
| 7,259,049 B2 | 8/2007 | Chan et al. | 438/157 |
| 7,365,378 B2 | 4/2008 | Huang et al. | 257/288 |
| 7,659,213 B2 * | 2/2010 | Wei et al. | 438/766 |
| 2001/0010961 A1 | 8/2001 | Jung et al. | 438/279 |
| 2002/0111025 A1 | 8/2002 | Weybright et al. | 438/689 |
| 2002/0179982 A1 | 12/2002 | Cheng et al. | 257/401 |
| 2002/0190316 A1 | 12/2002 | Kwean et al. | 257/344 |
| 2003/0001200 A1 | 1/2003 | Divakaruni et al. | 257/330 |
| 2003/0224573 A1 | 12/2003 | Chidambarrao et al. | 438/258 |
| 2004/0033659 A1 | 2/2004 | Seitz et al. | 438/243 |
| 2004/0075111 A1 | 4/2004 | Chidambarrao et al. | 257/200 |
| 2004/0155282 A1 | 8/2004 | Kim | 257/315 |
| 2005/0045865 A1 | 3/2005 | Wang | 257/10 |
| 2005/0045968 A1 | 3/2005 | Kwean et al. | 257/408 |
| 2006/0084273 A1 | 4/2006 | Kohyama et al. | 438/694 |
| 2006/0166432 A1 | 7/2006 | Holmes et al. | 438/239 |
| 2007/0262451 A1 * | 11/2007 | Rachmady et al. | 257/758 |
| 2007/0281410 A1 | 12/2007 | Lee et al. | 438/197 |
| 2008/0029834 A1 | 2/2008 | Sell | 257/411 |
| 2008/0093681 A1 | 4/2008 | Sato | 257/412 |
| 2008/0230906 A1 | 9/2008 | Wong et al. | 257/751 |
| 2009/0057730 A1 | 3/2009 | Furukawa et al. | 257/288 |

* cited by examiner

BORDERLESS CONTACTS FOR SEMICONDUCTOR DEVICES

TECHNICAL FIELD

The exemplary embodiments of this invention relate generally to semiconductor structures and, more specifically, relate to borderless contacts for semiconductor devices and the formation thereof.

BACKGROUND

The following abbreviations are utilized herein:
CA contact area
CD critical dimension
CMOS complementary metal-oxide semiconductor
CVD chemical vapor deposition
DRAM dynamic random access memory
FET field effect transistor
FUSI fully silicided
LPCVD low-pressure CVD
MOSFET metal oxide semiconductor field effect transistor
PECVD plasma-enhanced CVD
RIE reactive ion etch
STI shallow trench isolation Semiconductors and integrated circuit chips have become ubiquitous within many products due to their continually decreasing cost and size. In the microelectronics industry as well as in other industries involving construction of microscopic structures (e.g., micromachines, magnetoresistive heads, etc.) there is a continued desire to reduce the size of structural features and microelectronic devices and/or to provide a greater amount of circuitry for a given chip size. Miniaturization in general allows for increased performance (more processing per clock cycle and less heat generated) at lower power levels and lower cost. Present technology is at or approaching atomic level scaling of certain micro-devices such as logic gates, FETs and capacitors, for example. Circuit chips with hundreds of millions of such devices are not uncommon. Further size reductions appear to be approaching the physical limit of trace lines and micro-devices that are embedded upon and within their semiconductor substrates. The present invention is directed to such micro-sized devices.

Basically, a FET is a transistor having a source, a gate, and a drain. The action of the FET depends on the flow of majority carriers along a channel between the source and drain that runs past the gate. Current through the channel, which is between the source and drain, is controlled by the transverse electric field under the gate. More than one gate (multi-gate) can be used to more effectively control the channel. The length of the gate determines how fast the FET switches, and can be about the same as the length of the channel (i.e., the distance between the source and drain). Multi-gate FETs are considered to be promising candidates to scale CMOS FET technology down to the sub-22 nm regime.

The size of FETs has been successfully reduced through the use of one or more fin-shaped channels. A FET employing such a channel structure may be referred to as a FinFET. Previously, CMOS devices were substantially planar along the surface of the semiconductor substrate, the exception being the FET gate that was disposed over the top of the channel. Fins break from this paradigm by using a vertical channel structure in order to maximize the surface area of the channel that is exposed to the gate. The gate controls the channel more strongly because it extends over more than one side (surface) of the channel. For example, the gate can enclose three surfaces of the three-dimensional channel, rather than being disposed only across the top surface of the traditional planar channel.

As the CDs of CMOS devices are being aggressively scaled, forming contacts on those small devices is becoming more and more difficult do to the tight overlay tolerance. Borderless contacts and techniques relating thereto help reduce the amount of space required for contacts, and enable production of smaller devices having a tighter pitch. Reference in regard to borderless contacts may be made to: commonly-assigned U.S. Pat. No. 4,944,682 to Cronin et al., commonly-assigned U.S. Pat. No. 4,966,870 to Barber et al. and commonly-assigned U.S. Pat. No. 5,759,867 to Armacost et al.

Borderless contacts have been used in devices with tight pitch, particularly in memory products (e.g., DRAM). Reference in this regard is made to commonly assigned U.S. Pat. No. 6,709,926 to Chidambarrao et al. Borderless contacts are usually formed with a gate stack including a gate dielectric, a gate conductor and an insulating cap. The gate conductor usually comprises polycrystalline silicon (also referred to herein as "poly" or "polysilicon"). In some cases, metal or metal silicide is added on top of the poly in order to lower gate resistance. Reference in this regard may be made to U.S. Pat. No. 5,966,597 to Wright and U.S. Pat. No. 6,236,094 to Wright.

High-k/metal or FUSI gates have been proposed and projected to fulfill future CMOS scaling. A MOSFET with a metal gate can be formed by either so-called "gate-first" techniques or "gate-last" techniques. In a gate-first technique, metal gates are deposited and patterned during gate formation. A poly cap layer on top of the metal layer is usually provided to achieve proper and stable workfunction of the gate stack. It is often further desired to form a silicide on top of the poly cap layer after source/drain formation in order to lower gate resistance. In a gate-last technique, a dummy gate is first formed in order to facilitate transistor formation. The dummy gate is replaced, usually by a high-k/metal gate, after source/drain formation. In a FUSI technique, a poly gate is first formed in order to facilitate transistor formation. The entire portion of the poly gate is then converted to silicide (e.g., after source/drain formation).

BRIEF SUMMARY

In one exemplary embodiment of the invention, a semiconductor device comprising: a substrate; a borderless contact comprised of a metal; a gate structure on the substrate; a first spacer disposed between the gate structure and the borderless contact and comprised of a first spacer material; an interlevel dielectric that at least partially overlies the gate structure; and a second spacer disposed between at least a portion of the gate structure and the interlevel dielectric and comprised of a second spacer material that is different from the first spacer material.

In another exemplary embodiment of the invention, a method (e.g., to fabricate a semiconductor device having a borderless contact) comprising: forming a first gate structure on a substrate; depositing an interlevel dielectric over the first gate structure; planarizing the interlevel dielectric to expose a top surface of the first gate structure; removing at least a portion of the first gate structure; forming a second gate structure in place of the first gate structure; forming a contact area for the borderless contact by removing a portion of the interlevel dielectric; and forming the borderless contact by filling the contact area with a material comprised of a metal.

In a further exemplary embodiment of the invention, a semiconductor device comprising: a substrate; and a gate structure on the substrate, the gate structure comprising a layer of semiconductor material overlying the substrate, a layer comprised of a metal overlying the layer of semiconductor material, a layer comprised of polycrystalline silicon overlying the layer comprised of a metal, a layer of silicide overlying the layer comprised of polycrystalline silicon and a cap layer overlying the layer of silicide.

In another exemplary embodiment of the invention, a semiconductor device comprising: a substrate; a gate structure on the substrate, the gate structure comprising a metal gate core that is adjacent to a layer of dielectric material on at least two surfaces of the metal gate core; and a cap layer overlying the layer of dielectric material and the metal gate core.

BRIEF DESCRIPTION OF THE SEVERAL VIEWS OF THE DRAWINGS

The foregoing and other aspects of embodiments of this invention are made more evident in the following Detailed Description, when read in conjunction with the attached Drawing Figures, wherein.

DETAILED DESCRIPTION

1. Further Considerations

Figure 1:
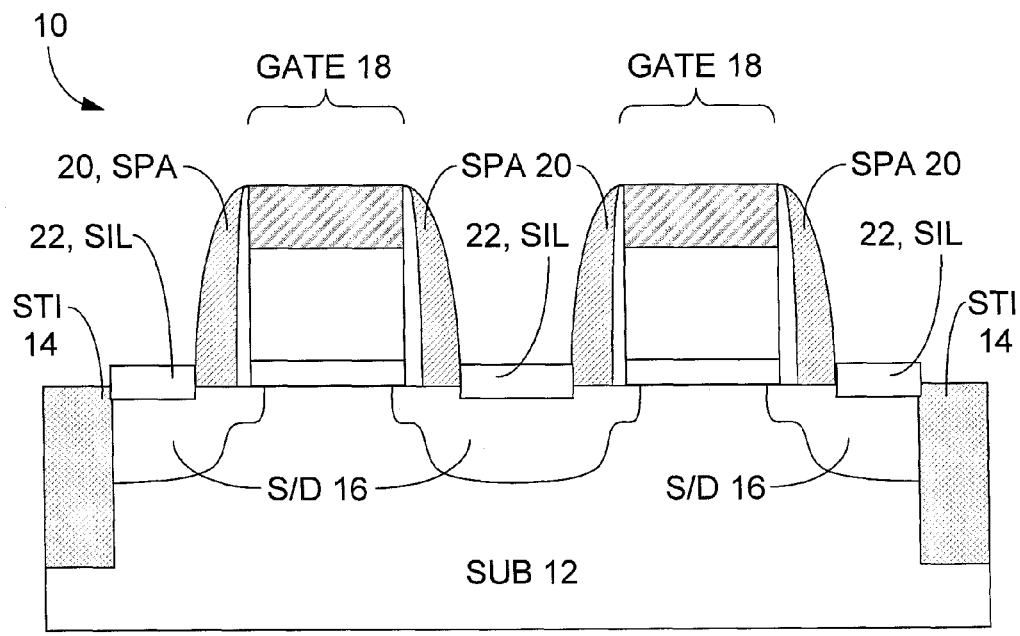
FIG. 1 shows an exemplary, conventional multi-FET structure.

FIG. 1 shows an exemplary, conventional multi-FET structure 10. The structure 10 includes a number of components or regions that are overlying or embedded in a substrate (SUB) 12. There are STI regions 14 and source/drain regions (S/D) 16. The S/D 16 lies below portions of the gates 18. Each gate includes a number of layers (not labeled), such as: a dielectric layer (e.g., silicon oxide) overlying the substrate, a poly layer overlying the dielectric layer and a cap layer (e.g., nitride) overlying the poly. Surrounding each gate 18 are spacers (SPA) 20. The SPA 20 and the nitride cap protect the other layers of the gate 18 from undesired contacts and shorts. To reduce resistance, there may be a layer of silicide (SIL) 22 over the S/D 16.

Figure 2:
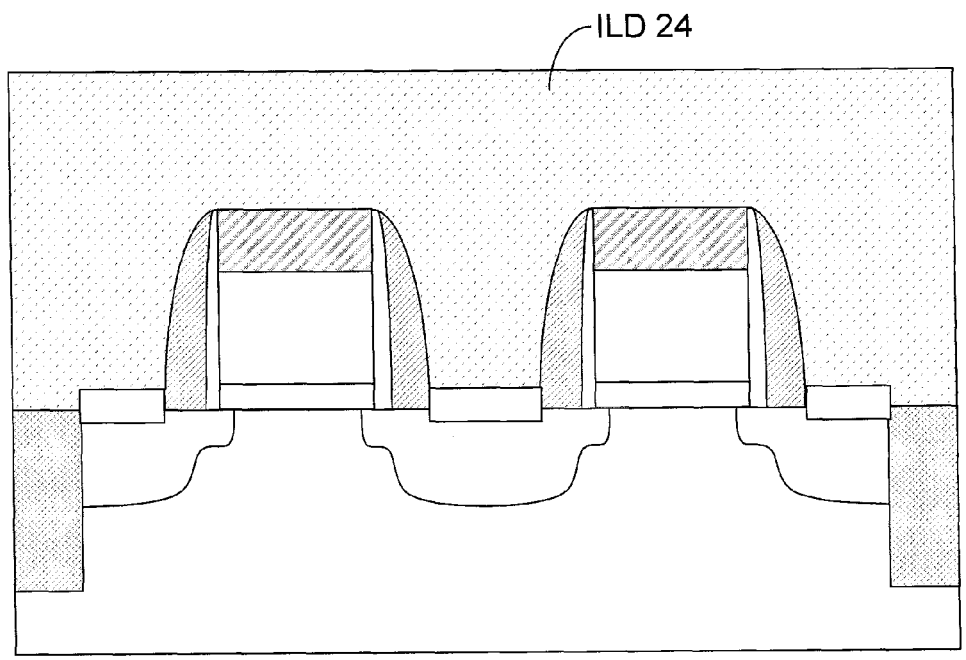
FIGS. 2-4 illustrate a conventional technique for forming a borderless contact in the multi-FET structure of FIG. 1.
Figure 3:
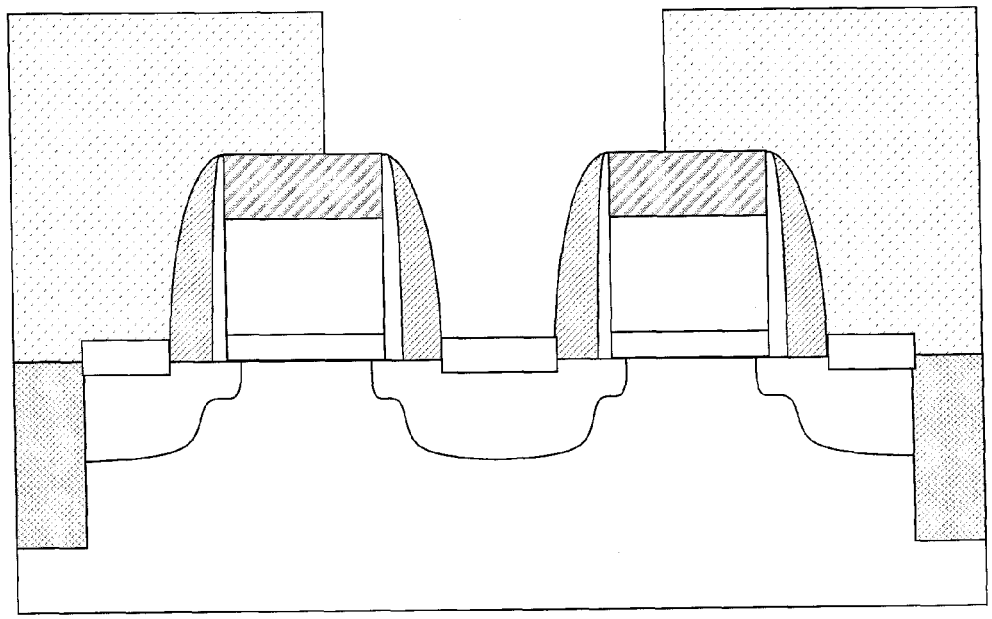
Figure 4:
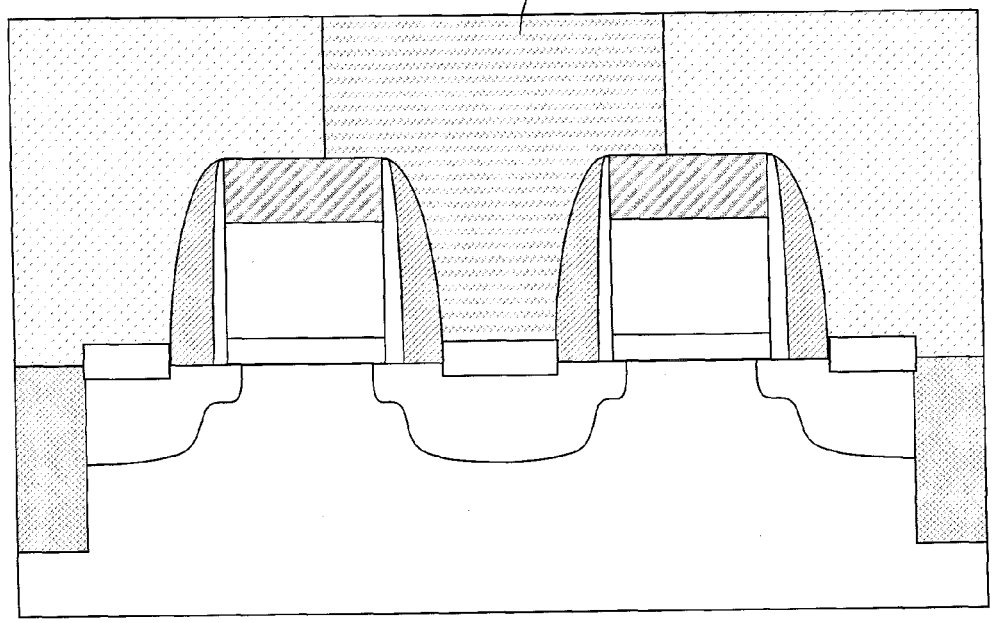

FIGS. 2-4 illustrate a conventional technique for forming a borderless contact in the multi-FET structure of FIG. 1. As shown in FIG. 2, an interlevel dielectric (ILD) 24 (e.g., an oxide) is deposited over the structure 10. In FIG. 3, the contact is formed by patterning and RIE. To form the borderless contact, the etched region is filled with a metal at the CA 26, as depicted in FIG. 4.

In some cases, conventional techniques may result in a damaged spacer, for example, due to source/drain ion implantation, CA RIE or cleaning. Such a damaged spacer can cause electrical shorts between gate and CA contacts, for example. Furthermore, thick spacers for the silicide formation and a tight pitch may result in a small CA space, leading to a more difficult CA fill. In addition, the nitride spacer has a high parasitic capacitance, inhibiting operation of the final structure.

As noted above, device scaling results in a small space for forming the borderless contact. Pitch scaling means there is a narrower space for the CA and a bordered contact will not work. For example, consider a 22 nm node having a pitch of 80 nm, a gate length of about 25 nm and a spacer thickness of about 18 nm per side. This leaves about 19 nm of space for the CA (80−25−2×18=19) which is too small for a bordered contact. Furthermore, and also as noted above, conventional borderless contact techniques have various problems. Therefore, further techniques are needed that improve upon conventional borderless contact techniques.

2. Various Exemplary Embodiments of the Invention

The exemplary embodiments of the invention provide a number of improvements over conventional borderless contacts and conventional borderless contact techniques. Some of the exemplary embodiments seek to address and improve upon the above-noted shortcomings in prior art systems.

A first exemplary embodiment of the invention provides for replacement of the spacers after the contact via etch. As a non-limiting example, the replacement spacers may be low-k spacers to reduce the parasitic capacitance. The first exemplary embodiment also provides for formation of a second set of spacers above the cap of the gate (e.g., above the nitride cap and adjacent to the ILD). This second set of spacers may also be low-k spacers.

Various further exemplary embodiments of the invention describe how at least a portion of the gate is removed after deposition and planarization of the ILD. A second exemplary embodiment applies a borderless contact technique to a gate-first metal/poly/silicide gate stack. A cap layer (e.g., a nitride cap) is removed in order to enable the formation of silicide on the gate structure (e.g., overlying a poly layer). Another cap layer (e.g., a nitride cap) is then formed (e.g., overlying the silicide layer) by deposition and planarization.

A third exemplary embodiment describes a borderless contact technique that is utilized with a gate-last metal gate. A dummy gate is formed and, after deposition and planarization of the ILD, removed. A replacement gate structure is then formed. As a non-limiting example, the replacement gate structure may comprise a layer of high-k dielectric that surrounds (e.g., surrounds or encompasses on all sides except for a surface that is substantially coplanar with a top surface of the structure) a metal gate. A cap layer (e.g., a nitride cap) is subsequently formed by deposition and planarization.

A fourth exemplary embodiment provides for a borderless contact technique that is utilized with a FUSI gate. After deposition and planarization of the ILD, the cap layer (e.g., a nitride cap) is removed (e.g., using a RIE). The FUSI gate is then formed and another cap layer (e.g., a nitride cap) is formed (e.g., by deposition and planarization).

The exemplary embodiments of the invention and the various features and advantageous details thereof will be explained more fully with reference to the non-limiting exemplary embodiments that are illustrated in the accompanying drawings and detailed in the following description. It should be noted that the features illustrated in the drawings are not necessarily drawn to scale. Descriptions of well-known components and processing techniques (e.g., as known to one of ordinary skill in the art) are omitted so as to avoid unnecessarily obscuring the exemplary embodiments of the invention. The examples used herein are intended merely to facilitate an understanding of ways in which the exemplary embodiments of the invention may be practiced and to further enable those of ordinary skill in the art to practice the exemplary embodiments of the invention. Accordingly, the examples described herein should not be construed as limiting the scope of the exemplary embodiments of the invention.

As utilized herein, the following terms should be accorded the specified definitions and/or meanings. It is believed that these definitions and meanings are in accord with the understanding of one of ordinary skill in the art. "High-k," such as a high-k dielectric, refers to a material (e.g., a dielectric) that has a relatively high dielectric constant, such as a dielectric constant greater than 7 (the dielectric constant of silicon nitride), for example. "Low-k," such as a low-k dielectric, refers to a material (e.g., a dielectric) that has a relatively low dielectric constant, such as a dielectric constant less than 3.9 (the dielectric constant of silicon oxide), for example. "Poly" refers to at least one of polycrystalline silicon, polycrystalline germanium and polycrystalline silicon germanium.

A. First Exemplary Embodiment

In the first exemplary embodiment, a plurality of FETs, each having a gate stack comprised of a plurality of layers, are formed in accordance with conventional processes (e.g., provision of a substrate, formation of isolation such as STIs, deposition of layers, patterning of the layers into gate stacks using photolithography and etching, formation of oxide and/or nitride spacers around the gate stacks (e.g., via deposition and etching or via oxide growth), ion implantation for the source/drain regions). As a non-limiting example, the plurality of FETs may be similar to those shown in FIG. 1. For example, the gate structure may comprise: a dielectric layer (e.g., silicon oxide, silicon nitride, silicon oxynitride, a high-k dielectric material, or any suitable combination of such materials.) overlying the substrate, a poly layer overlying the dielectric layer and a cap layer (e.g., nitride) overlying the poly. Surrounding each gate are spacers. As non-limiting examples, the nitride cap may be formed using a LPCVD process (e.g., a LPCVD nitride) and the spacers may be formed using a PECVD process (e.g., a PECVD nitride). As a further non-limiting example, there may be a plurality of spacers (e.g., an inner oxide spacer and an outer nitride spacer). Silicide may be formed at the source/drain regions.

Figure 5:
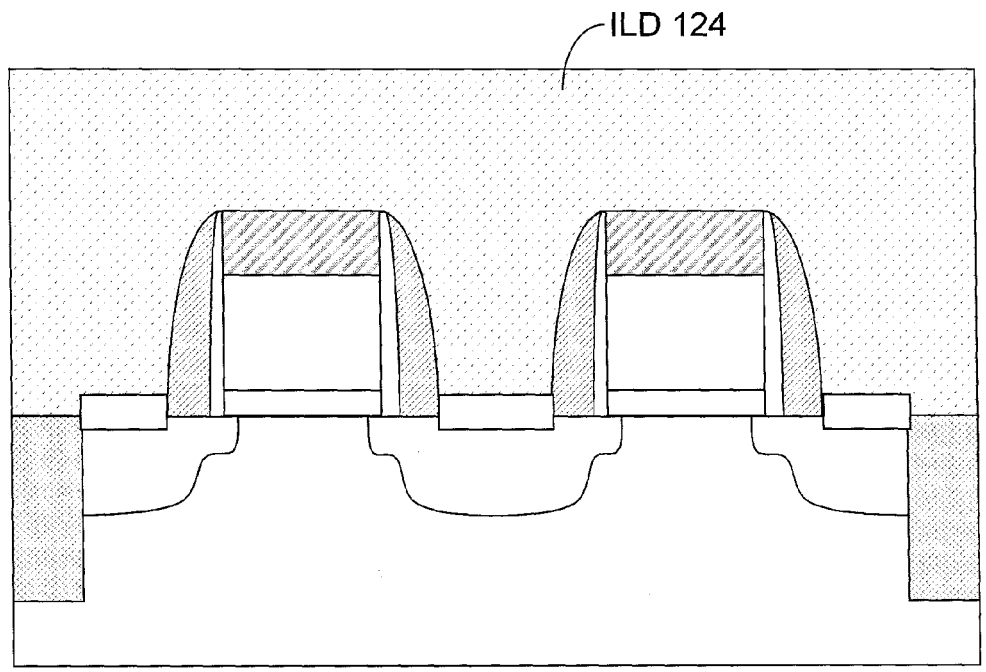
FIGS. 5-10 show a first technique for forming a borderless contact in a semiconductor device in accordance with a first exemplary embodiment of the invention.
Figure 6:
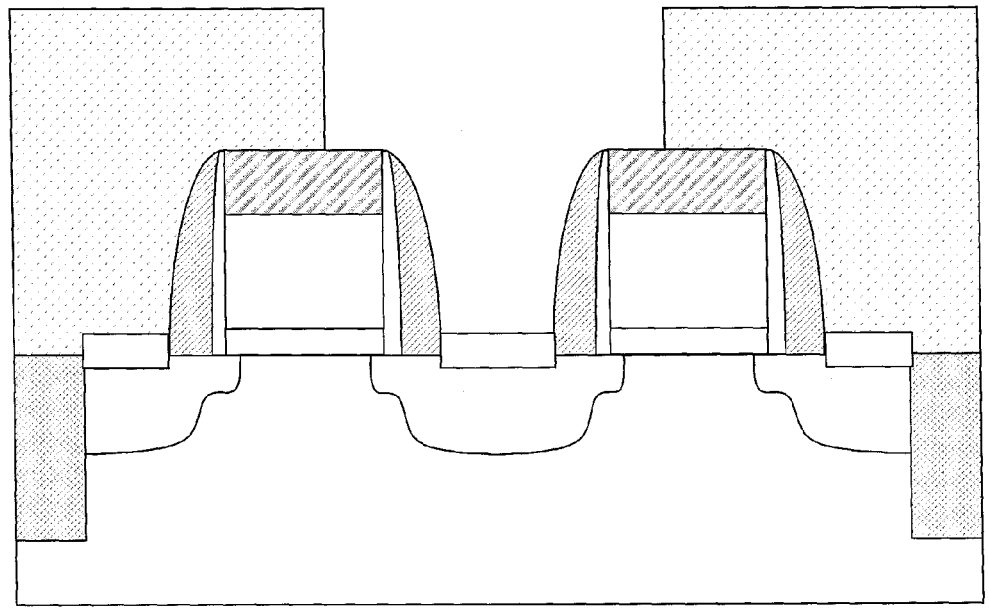

An ILD 124 (e.g., an oxide) is deposited, resulting in the structure shown in FIG. 5. The contact via is formed, as illustrated in FIG. 6, by patterning and etching (e.g., RIE). These processes may damage the spacers around the gate (e.g., the outer nitride spacers).

Figure 7:
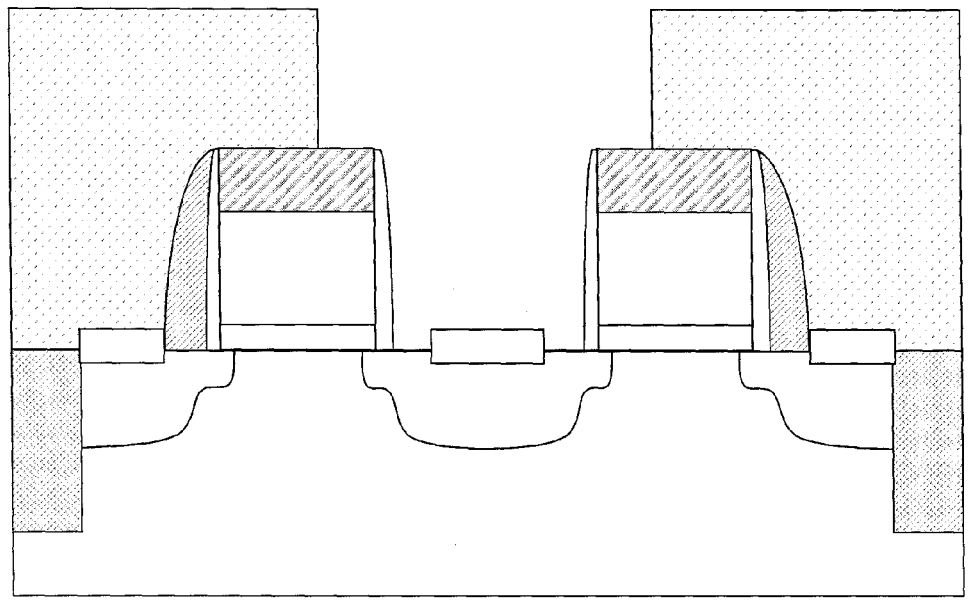

In accordance with the first exemplary embodiment, and as depicted in FIG. 7, the (possibly damaged) spacers are removed prior to filling the contact with metal (e.g., a metal-containing material). While FIG. 7 shows the removal of only the outer spacers (e.g., the outer nitride spacers), in other exemplary embodiments the inner spacers (e.g., the inner oxide spacers) are also removed.

As non-limiting examples, described below are several methods for removing damaged PECVD nitride spacers. A selective etch (e.g., a wet etch process with an etch solution containing hydrofluoric/ethylene glycol (HF/EG) or hot phosphoric acid) or a dry etch (e.g., a chemical downstream etch process) can be used to remove the PECVD nitride selective to the LPCVD nitride (of the nitride cap) and the ILD. As a further non-limiting example, an etch selectivity greater than 5:1 is achievable. Alternatively, a material other than nitride can be used as the gate cap layer (e.g., silicon carbon). As a further alternative, a non-selective nitride etch may be performed. In this case, one can rely on a thickness difference between the nitride spacer and the nitride gate cap to ensure preservation of the nitride gate cap. For example, the nitride spacer may be about 200 Å (about 200 angstroms) thick and the nitride gate cap may be about 400 Å thick. Therefore, a 250 Å nitride etch, even without selectivity, will completely remove the nitride spacer while leaving a nitride gate cap of about 150 Å thickness.

Figure 8:
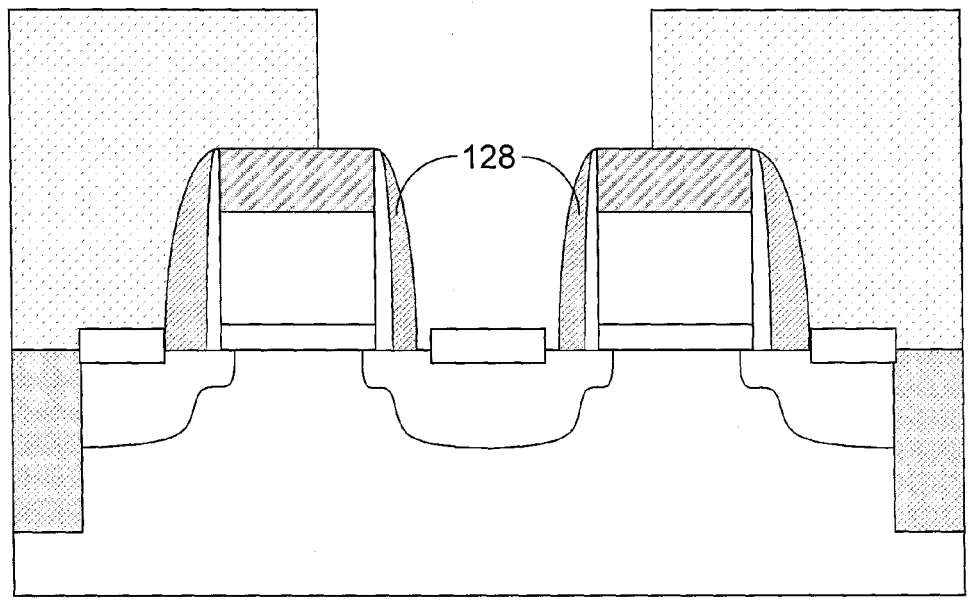

After removal of the spacers, new replacement spacers 128 are formed as shown in FIG. 8. The new replacement spacers 128 can be formed by any suitable technique, such as a film deposition process followed by a RIE process, for example. The replacement spacers 128 may comprise any suitable insulating material including, but not limited to: silicon oxide, silicon nitride, silicon oxynitride, silicon carbide, a low-k material or any suitable combination of such materials. As a non-limiting example, the replacement spacers 128 may comprise a low-k material. Exemplary low-k dielectric materials include organosilicate glass (OSG) and SiLK™. Furthermore, the replacement spacers 128 may be thinner than the original spacers. Formation of these new replacement spacers 128 cures potential defects in the original spacers, such as a pinhole, for example.

Figure 9:
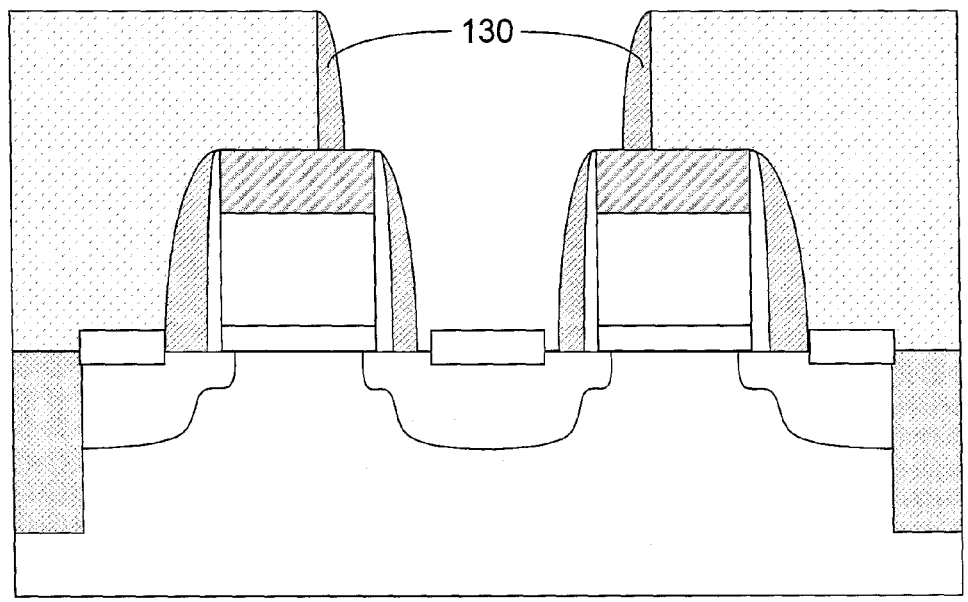
Figure 10:
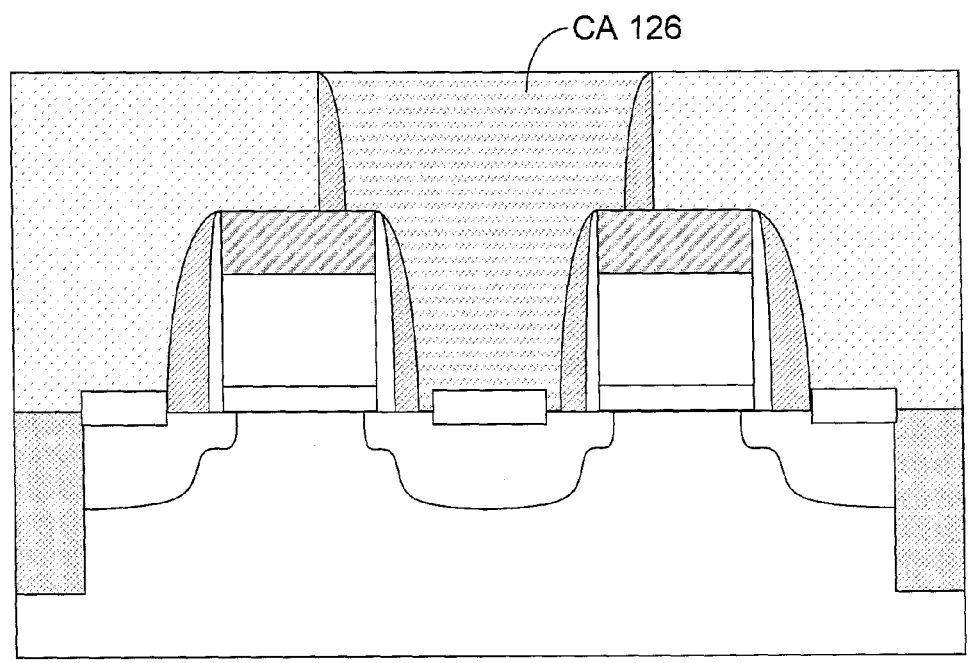

In conjunction with forming the replacement spacers 128, an additional set of spacers 130 may be formed. These additional spacers 130 are formed on the sidewalls of the ILD that is located above the gate structures, as illustrated in FIG. 9. To form the borderless contact, the etched region is filled with conductive material (e.g., a metal, a metal-containing material, a material comprising a metal) at the CA 126, as depicted in FIG. 10.

Forming the new replacement spacers 128 after the contact via etch provides improved isolation between the contact and the gate. This exemplary technique also enables the usage of narrow spacers to facilitate the CA fill (i.e., a wide CA space) and the usage of low-k spacers to reduce parasitic capacitance. In addition, this exemplary technique can provide asymmetric spacers, for example, whereby the original (e.g., nitride) spacers covered by the ILD have a first thickness and the new replacement (e.g., low-k) spacers have a second thickness (e.g., that is thinner than the first thickness).

B. Second Exemplary Embodiment

In the second exemplary embodiment, a plurality of FETs (e.g., a multi-FET structure 210), each having a gate stack comprised of a plurality of layers, are formed in accordance with conventional processes (e.g., provision of a substrate, formation of STIs, deposition of layers, patterning of the layers into gate stacks using photolithography and etching, formation of oxide or nitride spacers around the gate stacks (e.g., via deposition and etching or via oxide growth), ion implantation for the source/drain regions).

Figure 11:
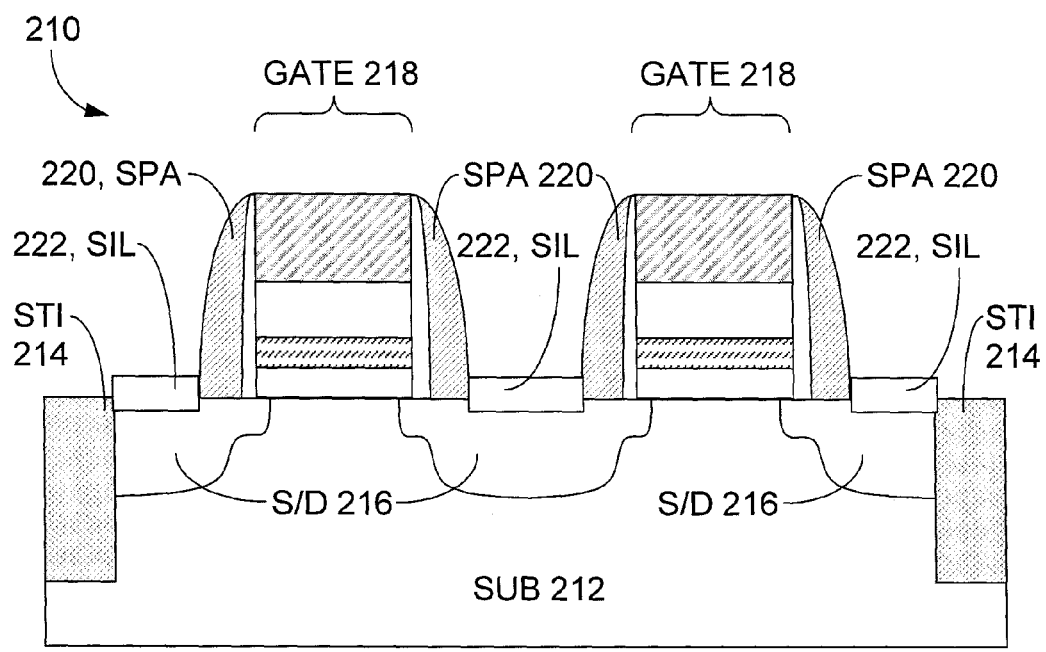
FIGS. 11-19 illustrate a second technique for forming a borderless contact in a semiconductor device in accordance with a second exemplary embodiment of the invention.

FIG. 11 shows an exemplary multi-FET structure 210. The structure 210 includes a number of components or regions that are overlying or embedded in a substrate (SUB) 212. There are STI regions 214 and source/drain regions (S/D) 216. The S/D 216 lie below portions of the gates 218. Each gate includes a number of layers as described further below. Surrounding each gate 218 are spacers (SPA) 220. The SPA 220 and the cap protect the other layers of the gate 218 from undesired contacts and shorts. To reduce resistance, there may be a layer of silicide (SIL) 222 over the S/D 216.

Figure 12:
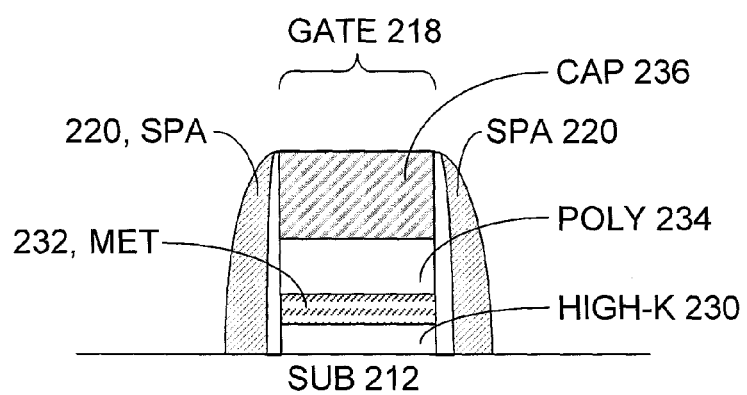

FIG. 12 shows an exemplary gate stack 218 for the multi-FET structure 210 of FIG. 11. The exemplary gate stack 218 includes: a high-k dielectric layer (HIGH-K) 230 overlying the SUB 212, a metal layer (MET) 232 overlying the HIGH-K 230, a poly layer (POLY) 234 overlying the HIGH-K 230 and a cap layer (CAP) 236 overlying the POLY 234. As a non-limiting example, the CAP 236 may comprise a nitride cap or a nitride cap layer. For completeness, the SPA 220 surrounding the gate 218 are also shown in FIG. 12. As a non-limiting example, there may be a plurality of spacers (e.g., an inner oxide spacer and an outer nitride spacer).

Figure 13:
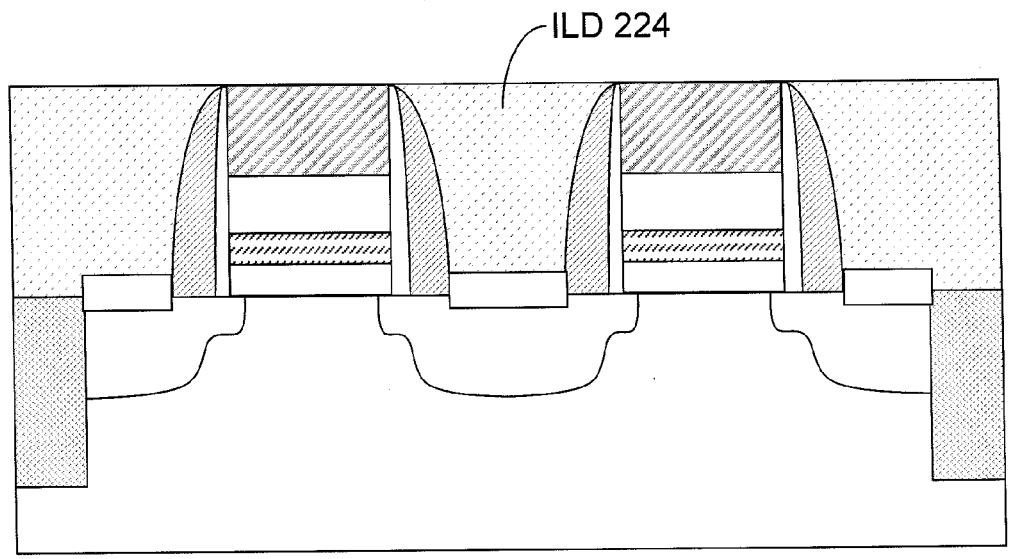
Figure 14:
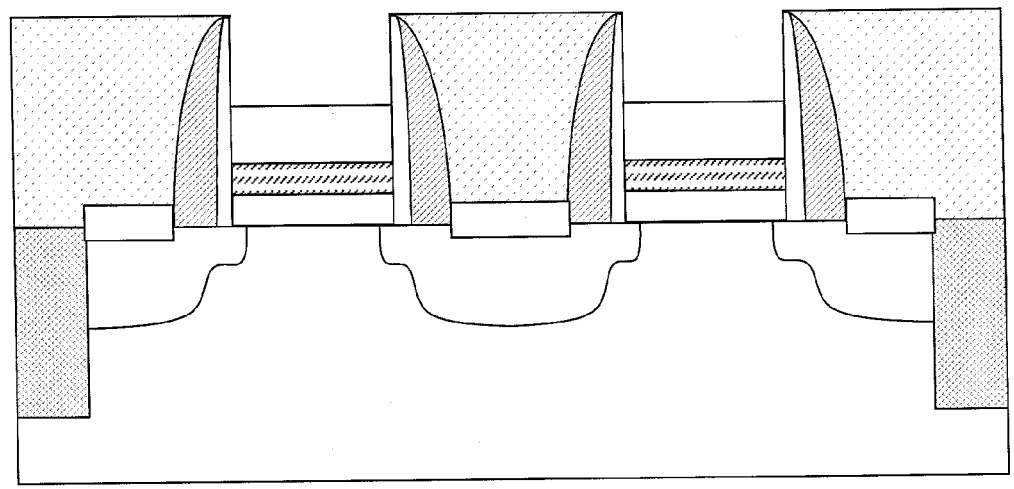
Figure 15:
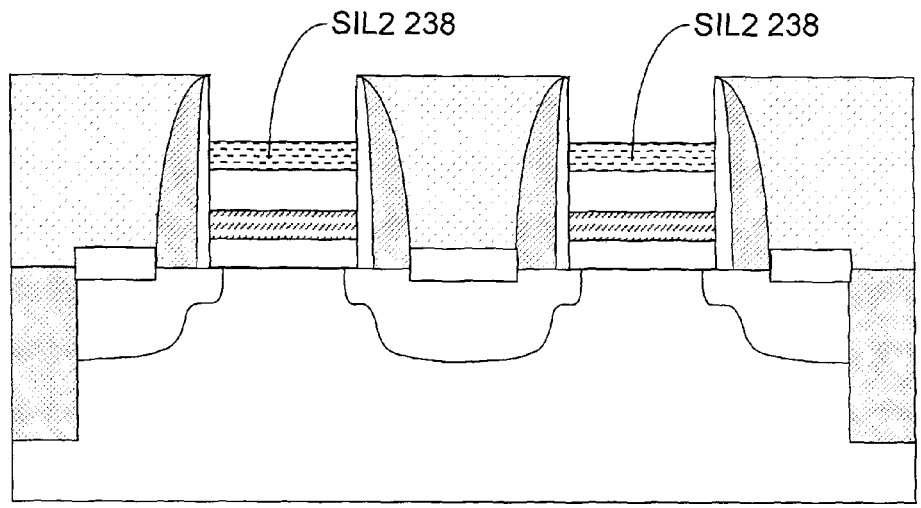
Figure 16:
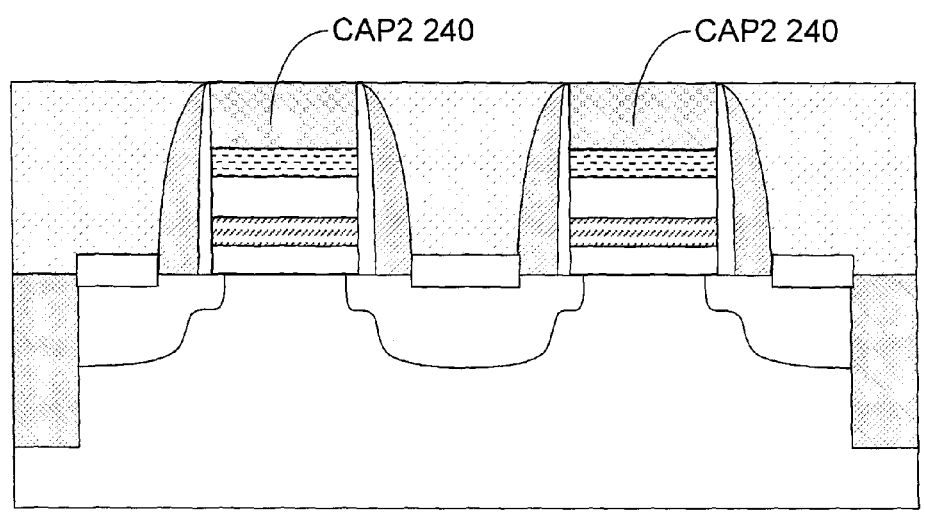
Figure 17:
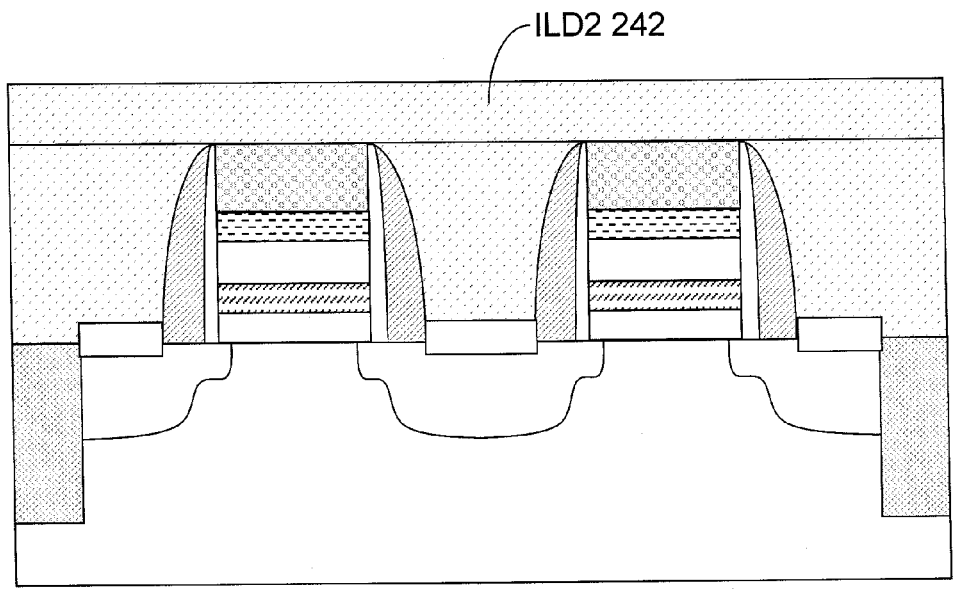
Figure 18:
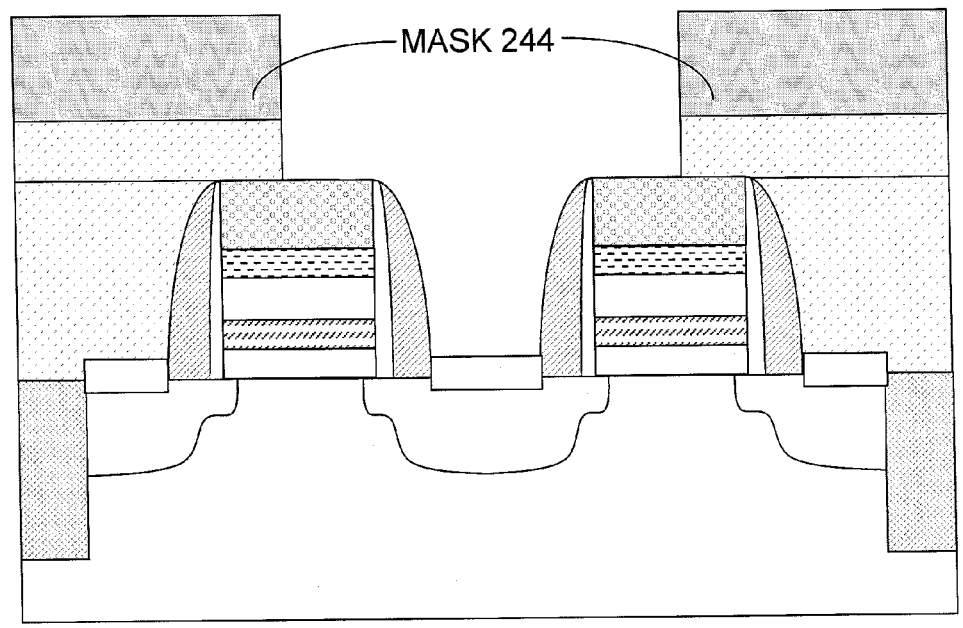
Figure 19:
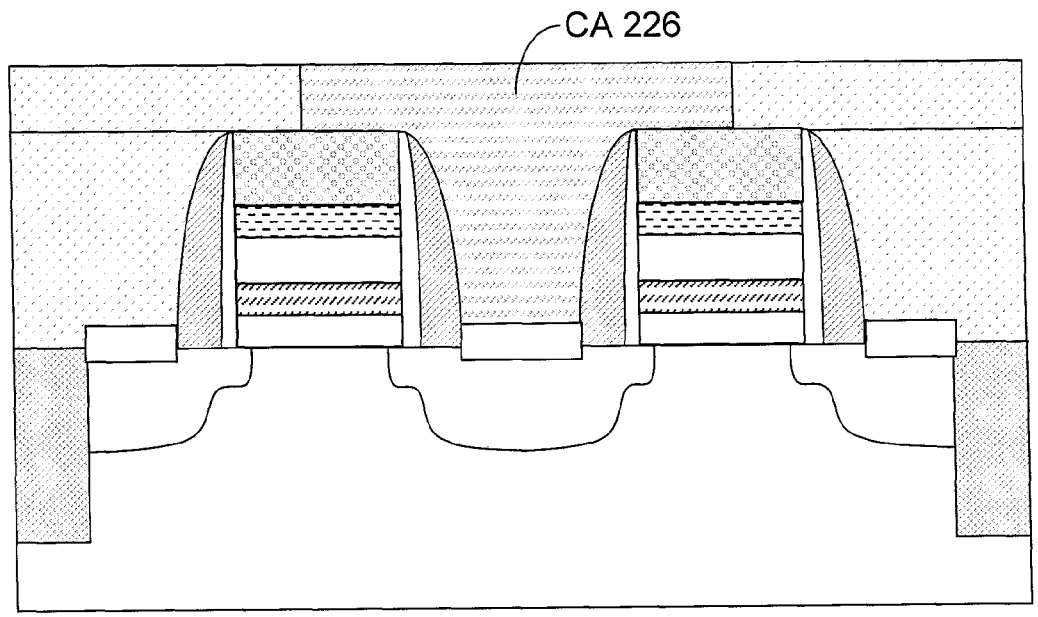

An interlayer dielectric (ILD) 224, such as an oxide with a nitride liner, for example, is deposited and planarized, resulting in the structure shown in FIG. 13. Subsequently, and as shown in FIG. 14, the CAPs 236 on each gate (or at least one gate) are removed. As depicted in FIG. 15, a layer of silicide (SIL2) 238 is formed on each gate (i.e., each gate whose cap was removed). As illustrated in FIG. 16, a new cap (CAP2) 240 is formed on each gate (i.e., each gate that received a layer of SIL2 238). The CAP2 240 may be formed by deposition and planarization. Furthermore, as a non-limiting example the CAP2 240 may comprise a nitride cap. Optionally, and as shown in FIG. 17, a second layer of ILD (ILD2) 242 is deposited and planarized. As shown in FIG. 18, a contact mask (MASK) 244 and a contact RIE are used to remove the ILD material from between the gates 218, thus forming the space for the borderless contact. The MASK 244 is removed and the contact area (CA) 226 is formed, as illustrated in FIG. 19, by filling the contact with conductive material, such as a metal, a metal-containing material or a material comprising a metal, as non-limiting examples. In some exemplary embodiments, the opening on the MASK 244 is wider than the space between the neighboring gates.

The exemplary technique illustrated by FIGS. 11-19 depict the formation of a borderless contact (e.g., in a MOSFET) with a gate-first metal gate capped by a low resistance poly/silicide layer 238. The final structure of the gate stack includes a high-k gate dielectric (HIGH-K 230) overlying the substrate (SUB 212), a metal layer (MET 232) overlying the high-k gate dielectric (HIGH-K 230), a poly layer (POLY 234) overlying the metal layer (MET 232), a silicide layer (SIL2 238) overlying the poly layer (POLY 234) and an insulating cap layer (CAP2 240) overlying the silicide layer (SIL2 238). The borderless contact is isolated from the gate by a spacer(s) (SPA 220) and the insulating cap layer (CAP2 240).

C. Third Exemplary Embodiment

Figure 20:
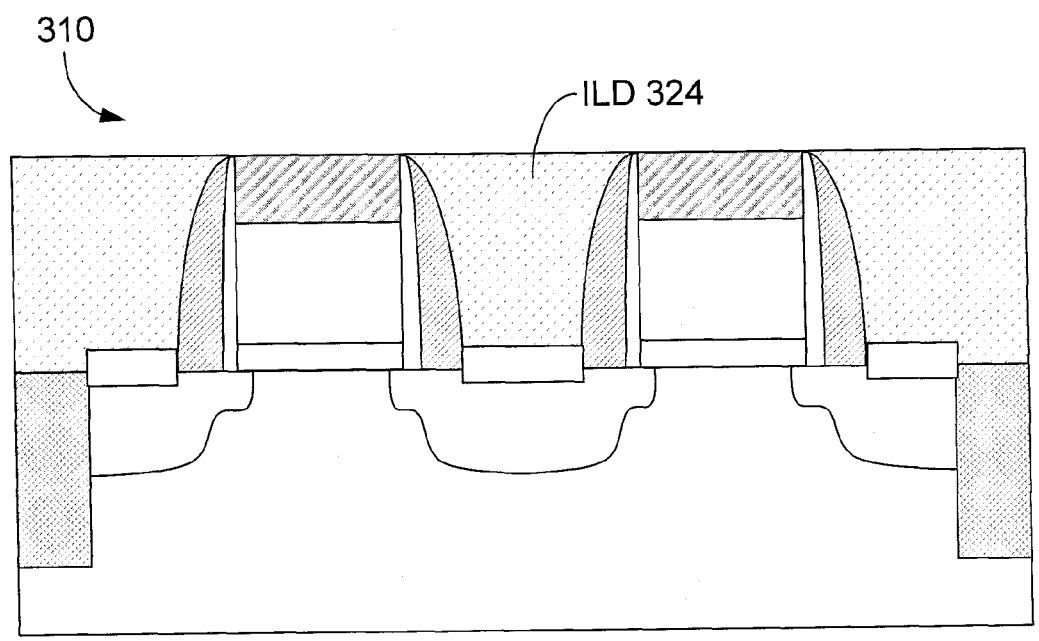
FIGS. 20-26 depict a third technique for forming a borderless contact in a semiconductor device in accordance with a third exemplary embodiment of the invention.

In the third exemplary embodiment, a plurality of FETs (e.g., a multi-FET structure 310 as shown in FIG. 20 or a multi-FET structure 10 as shown in FIG. 1), each having a gate stack comprised of a plurality of layers, are formed in accordance with conventional processes (e.g., provision of a substrate, formation of STIs, deposition of layers, patterning of the layers into gate stacks using photolithography and etching, formation of oxide or nitride spacers around the gate stacks (e.g., via deposition and etching or via oxide growth), ion implantation for the source/drain regions). As a non-limiting example, the plurality of FETs may be similar to those shown in FIG. 1. For example, the gate structure may comprise: a dielectric layer (e.g., silicon oxide) overlying the substrate, a poly layer overlying the dielectric layer and a cap layer (e.g., nitride) overlying the poly. Surrounding each gate are spacers. As a further non-limiting example, there may be a plurality of spacers (e.g., an inner oxide spacer and an outer nitride spacer). Silicide may be formed at the source/drain regions.

In comparison to the conventional FETs of FIG. 1 and the first and second exemplary embodiments, the initial FETs of the third exemplary embodiment comprise dummy gates. That is, since the third exemplary embodiment utilizes a gate-last technique, the initial gates are dummy gates (e.g., placeholders) that will be replaced at a later time (e.g., after deposition of the ILD). While the initial gates are dummy gates, they may be formed using similar (e.g., conventional) techniques.

Figure 21:
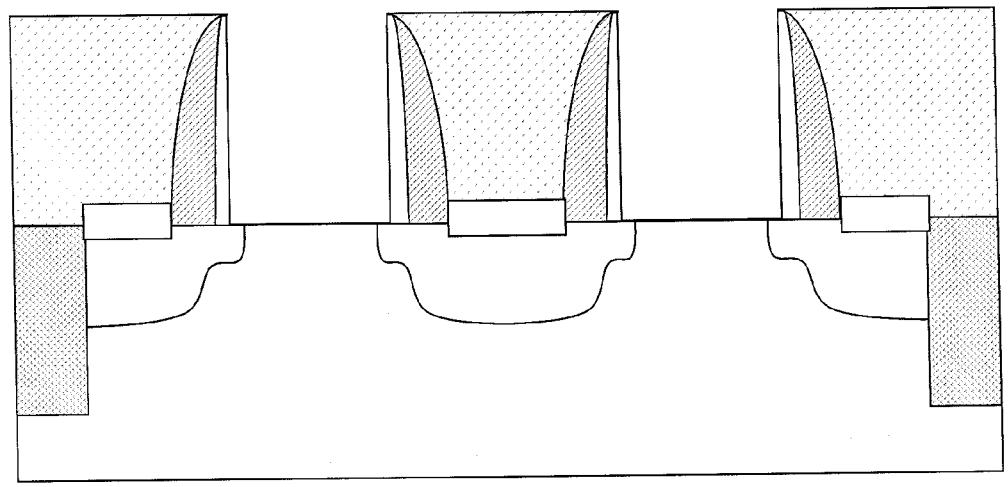
Figure 22:
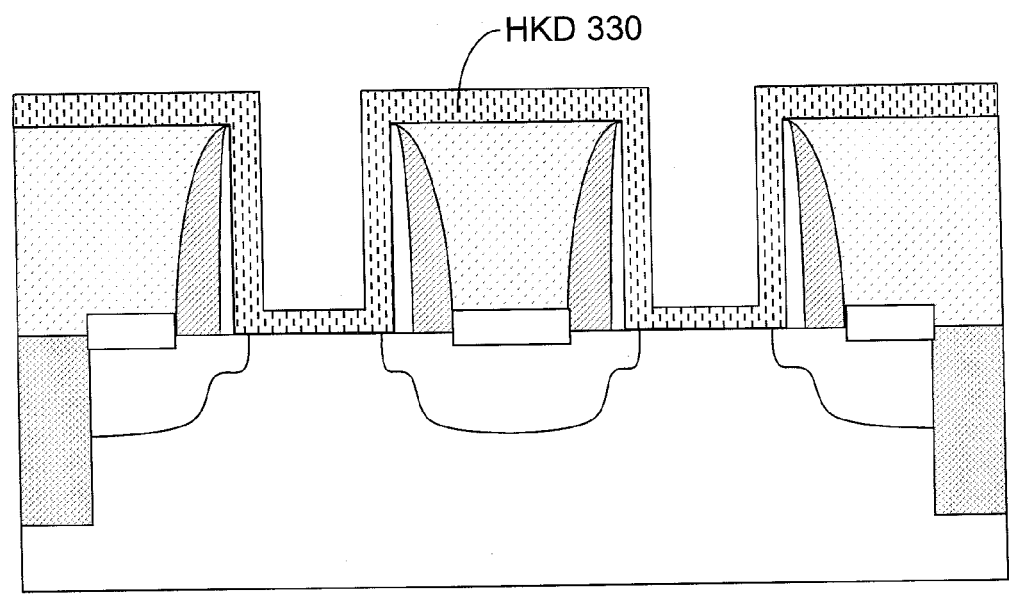
Figure 23:
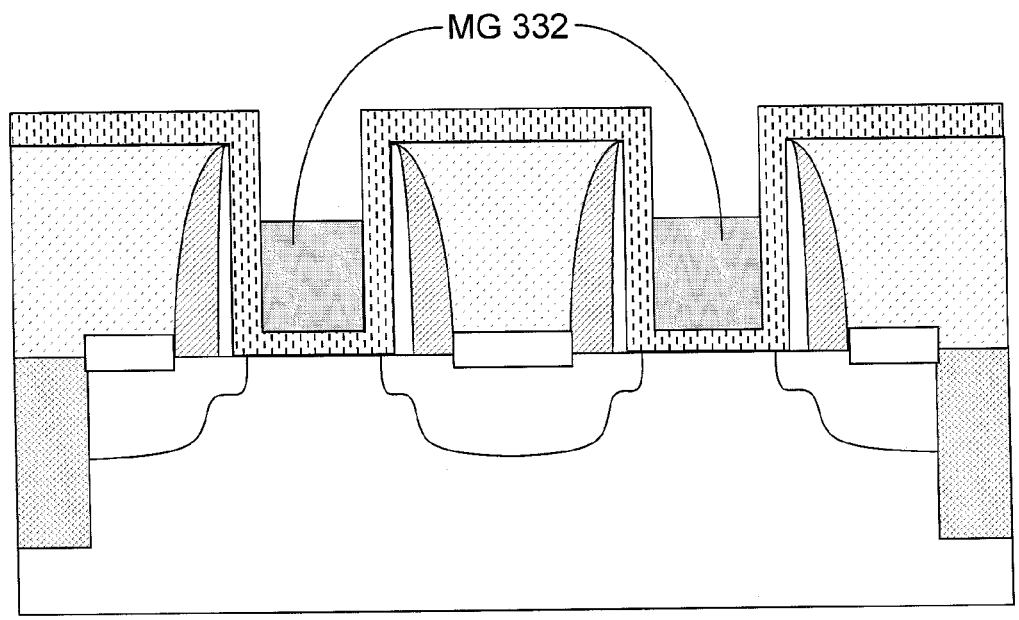
Figure 24:
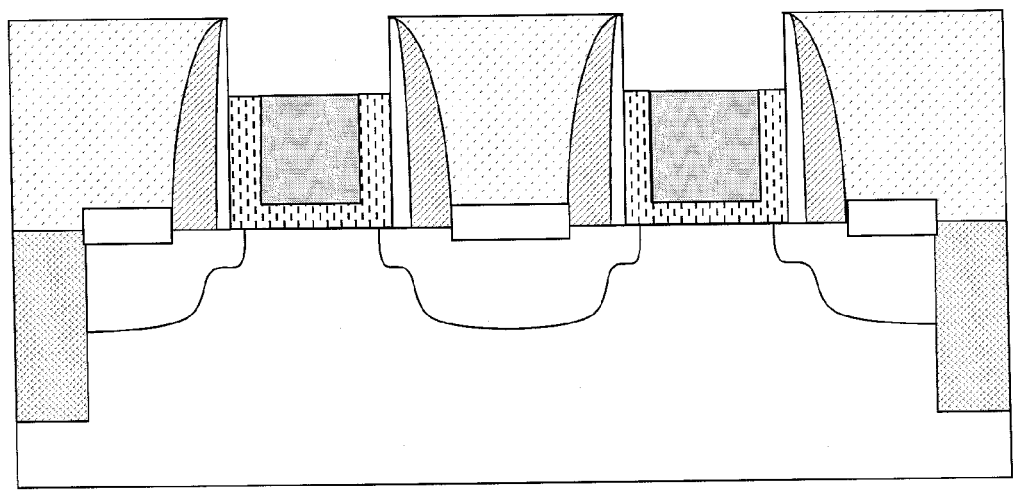

As shown in FIG. 20, an interlayer dielectric (ILD) 324 is deposited and planarized. As a non-limiting example, the ILD 324 may comprise an oxide with a nitride liner. Thereafter, and as illustrated in FIG. 21, the dummy gates are removed, for example, via selective etching or other conventional techniques. As depicted in FIG. 22, a high-k dielectric (HKD) 330 is deposited over the structure (e.g., the entire structure, including the ILD 324). Subsequently, and as shown in FIG. 23, a metal gate (MG) 332 is deposited, planarized and recessed. The MG 332 forms a metal gate core and is surrounded (e.g., adjacent) on at least two sides/surfaces by the dielectric (e.g., the HKD 330 is adjacent to at least sidewall surfaces and a bottom surface of the MG 332; the HKD 330 may not be adjacent to a top surface of the MG 332). As an optionally step, the exposed portions of the HKD 330 can be removed, resulting in the structure shown in FIG. 24.

Figure 25:
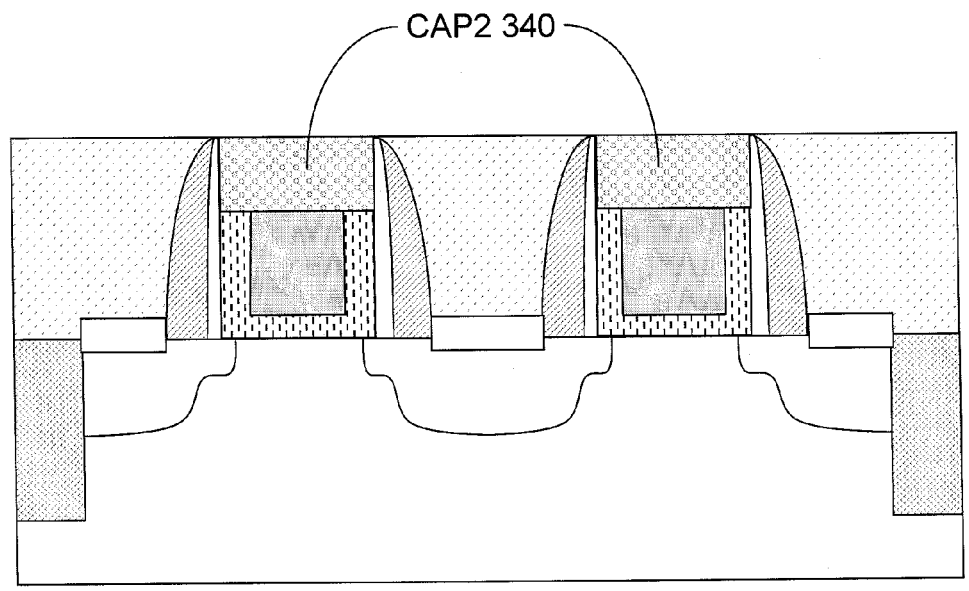
Figure 26:
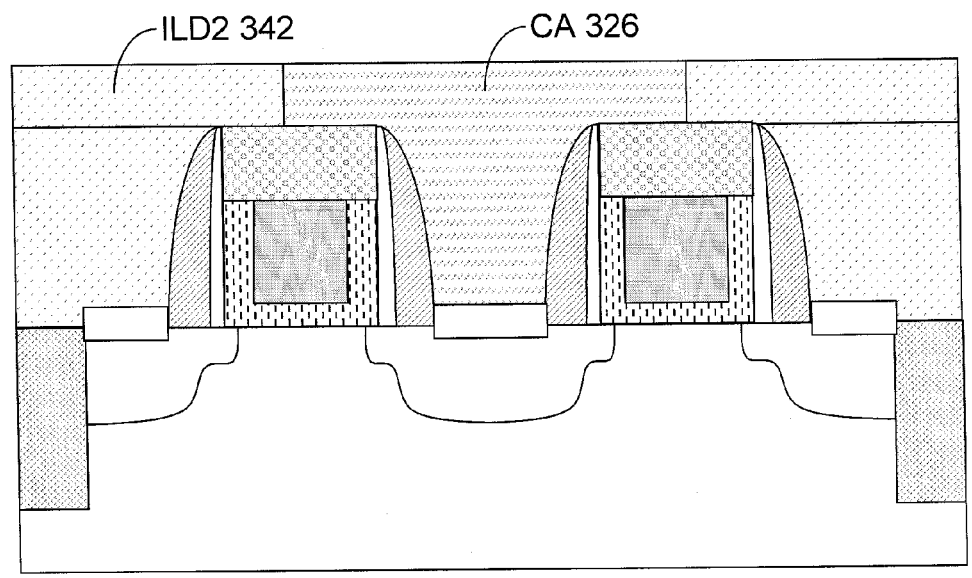

As illustrated in FIG. 25, a new cap (CAP2) 340 is formed on each gate (i.e., each gate for which a gate stack was formed in place of the removed dummy gate). The CAP2 340 may be formed by deposition and planarization. Furthermore, as a non-limiting example the CAP2 340 may comprise a nitride cap. Optionally, and as shown in FIG. 26, a second layer of ILD (ILD2) 342 is deposited and planarized. A contact mask and a contact RIE are used to remove the ILD material from between the gates, thus forming the space for the borderless contact. The mask is removed and the contact area (CA) 326 is formed, as illustrated in FIG. 26, by filling the contact with conductive material, such as a metal, a metal-containing material or a material comprising a metal, as non-limiting examples.

The exemplary technique illustrated by FIGS. 20-26 depict the formation of a borderless contact (e.g., in a MOSFET) with a gate-last gate (e.g., a metal gate). As a non-limiting example, the final structure of the gate stack may include a metal gate core (MG 332) that is surrounded (e.g., adjacent) on at least two sides/surfaces by a dielectric (e.g., a high-k dielectric such as HKD 330, which is adjacent to at least sidewall surfaces and a bottom surface of the MG 332). The dielectric may not be adjacent to a top surface of the metal gate core. The borderless contact is isolated from the gate by a spacer(s) and the insulating cap layer (CAP2 340).

D. Fourth Exemplary Embodiment

Figure 27:
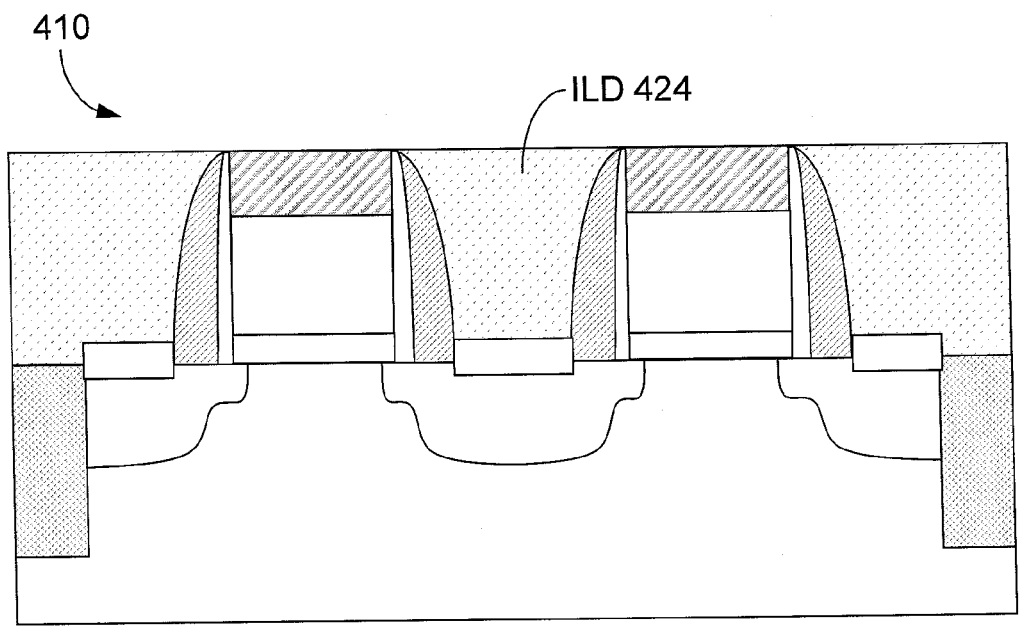
FIGS. 27-31 show a fourth technique for forming a borderless contact in a semiconductor device in accordance with a fourth exemplary embodiment of the invention.

In the fourth exemplary embodiment, a plurality of FETs (e.g., a multi-FET structure 410 as shown in FIG. 27 or a multi-FET structure 10 as shown in FIG. 1), each having a gate stack comprised of a plurality of layers, are formed in accordance with conventional processes (e.g., provision of a substrate, formation of STIs, deposition of layers, patterning of the layers into gate stacks using photolithography and etching, formation of oxide or nitride spacers around the gate stacks (e.g., via deposition and etching or via oxide growth), ion implantation for the source/drain regions). As a non-limiting example, the plurality of FETs may be similar to those shown in FIG. 1. For example, the gate structure may comprise: a dielectric layer (e.g., silicon oxide) overlying the substrate, a poly layer overlying the dielectric layer and a cap layer (e.g., nitride) overlying the poly. Surrounding each gate are spacers. As a further non-limiting example, there may be a plurality of spacers (e.g., an inner oxide spacer and an outer nitride spacer). Silicide may be formed at the source/drain regions.

Figure 28:
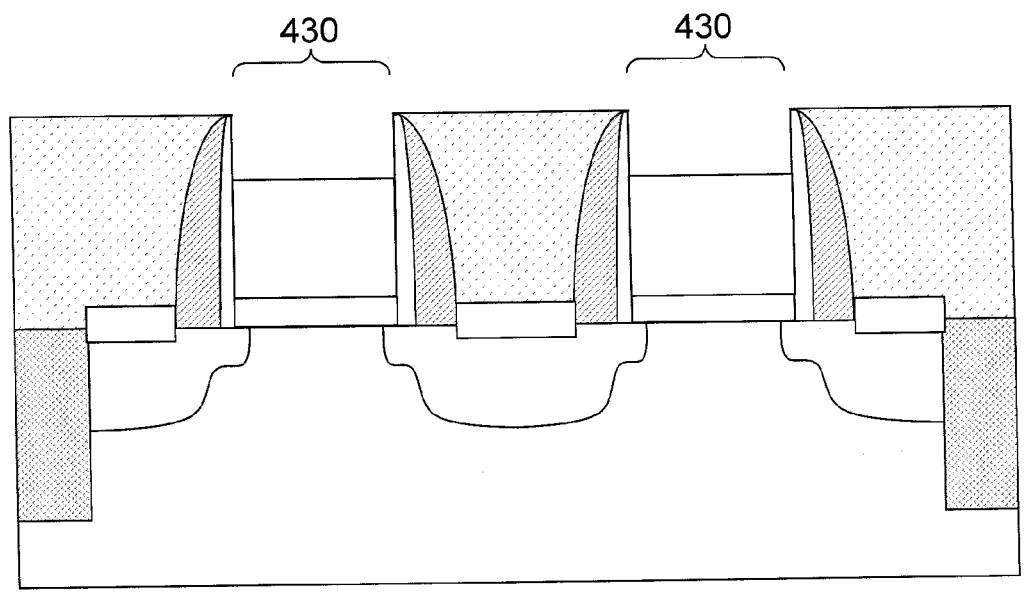

As shown in FIG. 27, an interlayer dielectric (ILD) 424 is deposited and planarized. As a non-limiting example, the ILD 424 may comprise an oxide with a nitride liner. Thereafter, and as illustrated in FIG. 28, the cap layer (e.g., the nitride cap) on each gate stack is removed, resulting in an exposed gate stack 430. As a non-limiting example, the exposed gate stacks 430 each may comprise a layer of gate dielectric (e.g., high-k dielectric material) overlying the substrate and a layer of polysilicon overlying the layer of gate dielectric. Also as a non-limiting example, the cap layer(s) may be removed using a RIE.

Figure 29:
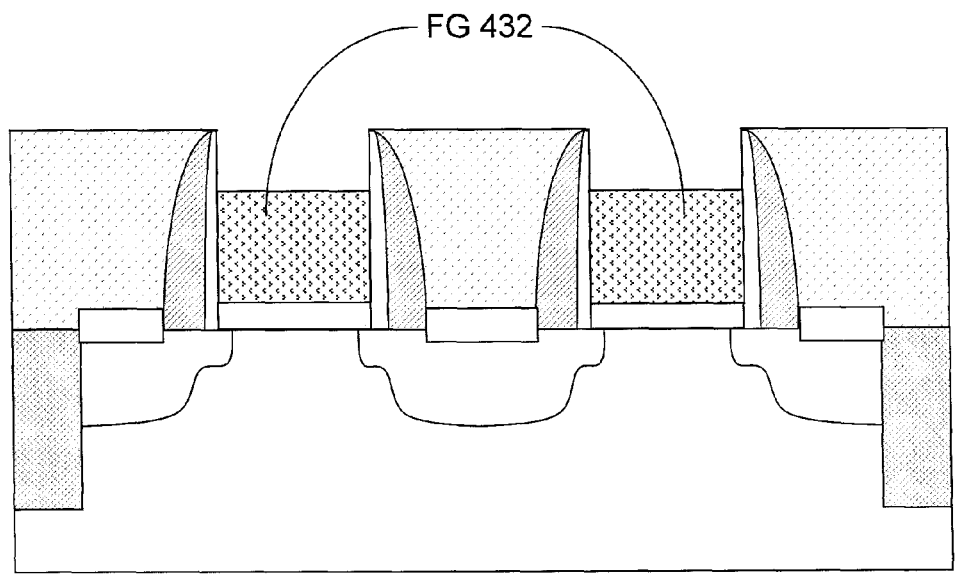

After the cap layer is removed for each gate in question, a FUSI gate (FG) 432 is formed for each gate stack, as illustrated in FIG. 29. The FG 432 may be formed using processes and techniques that are known in the art. As a non-limiting example, the FG 432 may be formed using the techniques disclosed by Tan et al. in "Formation of a Thermally Stable NiSi FUSI Gate Electrode by a Novel Integration Process," Mater. Res. Soc. Symp. Proc., Vol. 958 (0958-L06-08), 2007.

Figure 30:
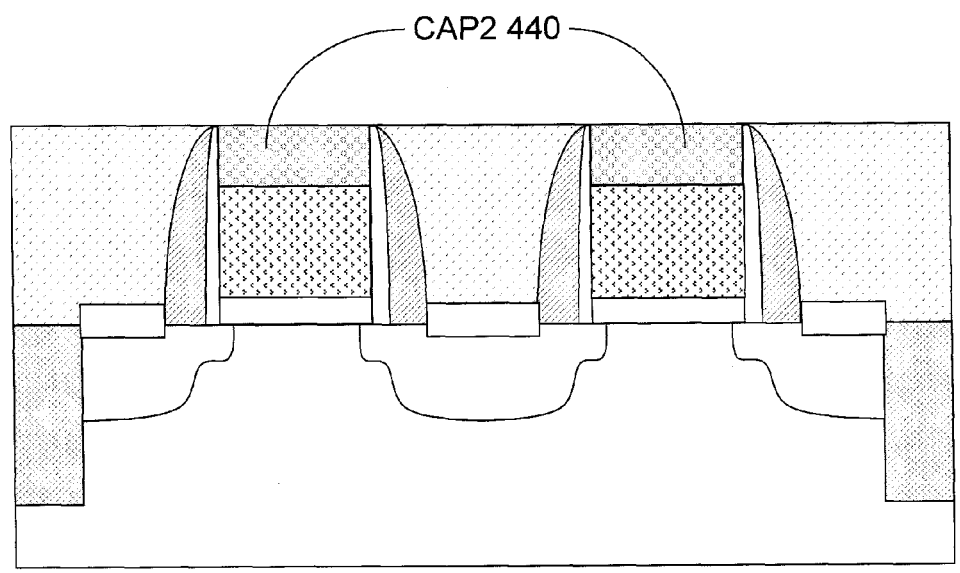
Figure 31:
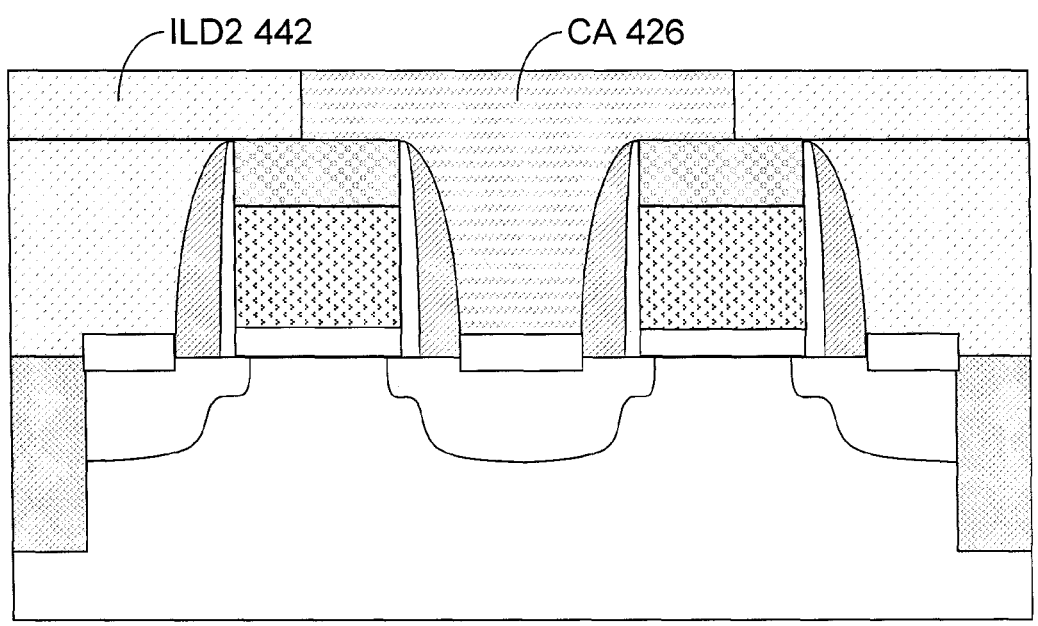

As depicted in FIG. 30, a new cap (CAP2) 440 is formed on each gate (i.e., each gate for which a FG 432 was formed). The CAP2 440 may be formed by deposition and planarization. Furthermore, as a non-limiting example the CAP2 340 may comprise a nitride cap. Optionally, and as shown in FIG. 31, a second layer of ILD (ILD2) 442 is deposited and planarized. A contact mask and a contact RIE are used to remove the ILD material from between the gates, thus forming the space for the borderless contact. The mask is removed and the contact area (CA) 426 is formed, as illustrated in FIG. 31, by filling the contact with conductive material, such as a metal, a metal-containing material or a material comprising a metal, as non-limiting examples.

The exemplary technique illustrated by FIGS. 27-31 depict the formation of a borderless contact (e.g., in a MOSFET) with a FUSI gate (e.g., FG 432). As a non-limiting example, the final structure of the gate stack includes a FUSI gate structure (e.g., FG 432) that has a replacement or new cap layer (e.g., a nitride cap such as CAP2 440). The borderless contact is isolated from the gate by a spacer(s) and the insulating cap layer (CAP2 440).

3. Further Exemplary Embodiments of the Invention

Below are further descriptions of various non-limiting, exemplary embodiments of the invention. The below-described exemplary embodiments are numbered separately for clarity purposes. This numbering should not be construed as entirely separating the various exemplary embodiments since aspects of one or more exemplary embodiments may be practiced in conjunction with one or more other aspects or exemplary embodiments.

Figure 32:
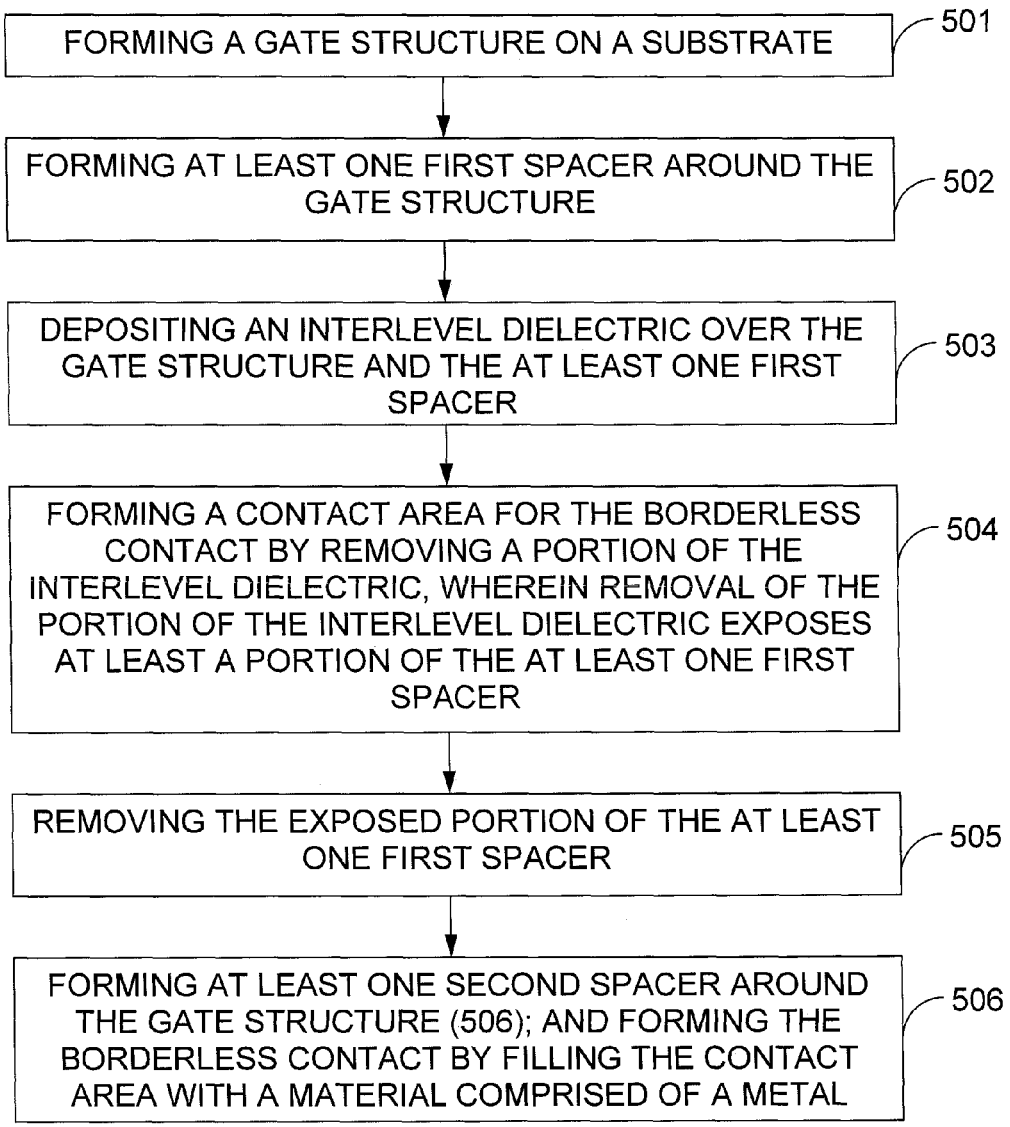
FIG. 32 depicts a flowchart illustrating one non-limiting example of a method for practicing the exemplary embodiments of this invention.

(1A) In one exemplary embodiment, and as shown in FIG. 32, a method (e.g., to fabricate a semiconductor device having a borderless contact) comprising: forming a gate structure on a substrate (501); forming at least one first spacer around the gate structure (502); depositing an interlevel dielectric over the gate structure and the at least one first spacer (503); forming a contact area for the borderless contact by removing a portion of the interlevel dielectric, wherein removal of the portion of the interlevel dielectric exposes at least a portion of the at least one first spacer (504); removing the exposed portion of the at least one first spacer (505); forming at least one second spacer around the gate structure (506); and forming the borderless contact by filling the contact area with a material comprised of a metal (507).

A method as above, further comprising: forming at least one third spacer above the gate structure and adjacent to the interlevel dielectric. A method as in any above, where forming at least one first spacer around the gate structure comprises forming the first spacer around the gate structure and forming a fourth spacer around the gate structure, where the fourth spacer comprises an inner spacer and the first spacer comprises an outer spacer. A method as in any above, where removing the exposed portion of the at least one first spacer does not result in removal of a portion of the fourth spacer. A method as in any above, where the at least one first spacer comprises a nitride and the at least one second spacer comprises a low-k dielectric material. A method as in any above, further comprising one or more additional aspects of the exemplary embodiments of the invention as described herein.

(1B) In a further exemplary embodiment, a semiconductor device comprising: a substrate; a borderless contact comprised of a metal; a gate structure on the substrate; a first spacer disposed between the gate structure and the borderless contact and comprised of a first spacer material; an interlevel dielectric that at least partially overlies the gate structure; and a second spacer disposed between at least a portion of the gate structure and the interlevel dielectric and comprised of a second spacer material that is different from the first spacer material.

The semiconductor device as above, further comprising a third spacer disposed on the gate structure and between the interlevel dielectric and the borderless contact. The semiconductor device as in any above, further comprising a fourth spacer disposed between the gate structure and the first spacer, where the fourth spacer comprises an inner spacer and the first spacer comprises an outer spacer. The semiconductor device as in any above, where the first spacer comprises a nitride and the second spacer comprises a low-k dielectric material. The semiconductor device as in any above, where the semiconductor device comprises a metal oxide semiconductor field effect transistor. The semiconductor device as in any above, further comprising one or more additional aspects of the exemplary embodiments of the invention as described herein.

Figure 33:
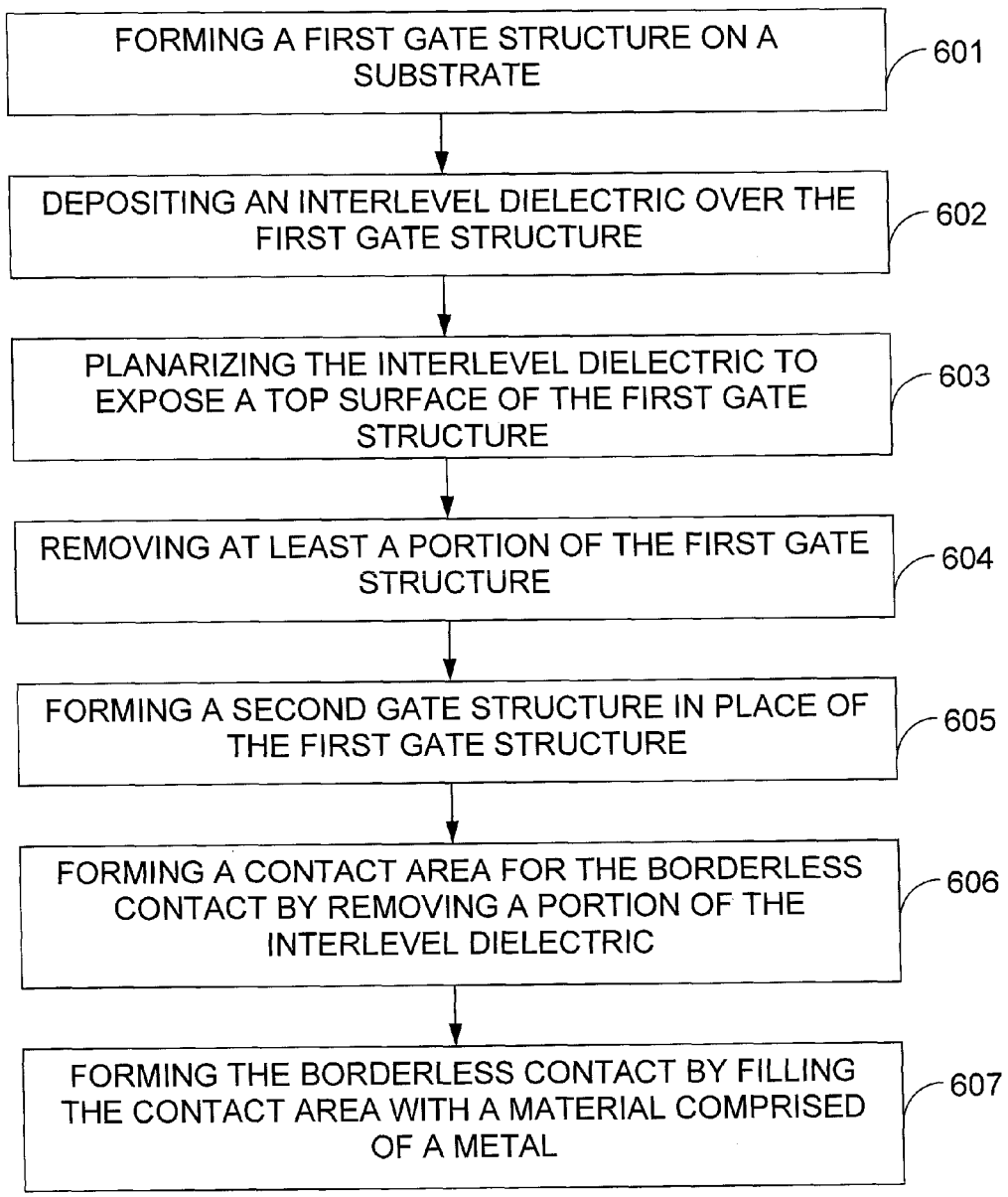
FIG. 33 shows a flowchart illustrating another non-limiting example of a method for practicing the exemplary embodiments of this invention.

(2) In another exemplary embodiment, and as shown in FIG. 33, a method (e.g., to fabricate a semiconductor device having a borderless contact) comprising: forming a first gate structure on a substrate (601); depositing an interlevel dielectric over the first gate structure (602); planarizing the interlevel dielectric to expose a top surface of the first gate structure (603); removing at least a portion of the first gate structure (604); forming a second gate structure in place of the first gate structure (605); forming a contact area for the borderless contact by removing a portion of the interlevel dielectric (606); and forming the borderless contact by filling the contact area with a material comprised of a metal (607).

A method as above, where the first gate structure comprises a dummy gate structure and where removing the at least a portion of the first gate structure comprises removing substantially all of the dummy gate structure. A method as in any above, where the removed portion of the first gate structure comprises a first cap layer of the first gate structure. A method as in any above, where forming the second gate structure comprises forming a layer of silicide and forming a second cap layer. A method as in any above, where forming the second gate structure comprises forming a fully silicided gate structure. A method as in any above, where the first gate structure comprises a layer of dielectric material overlying the substrate, a layer comprised of polycrystalline silicon overlying the layer dielectric material and the first cap layer overlying the layer comprised of polycrystalline silicon. A method as in any above, where forming the second gate structure comprises forming a second cap layer overlying the fully silicided gate. A method as in any above, where forming the contact area for the borderless contact comprises depositing a second layer of interlevel dielectric and planarizing the second layer of interlevel dielectric. A method as in any above, where the interlevel dielectric comprises an oxide with a nitride liner. A method as in any above, where the semiconductor device comprises a metal oxide semiconductor field effect transistor. A method as in any above, further comprising one or more additional aspects of the exemplary embodiments of the invention as described herein.

Figure 34:
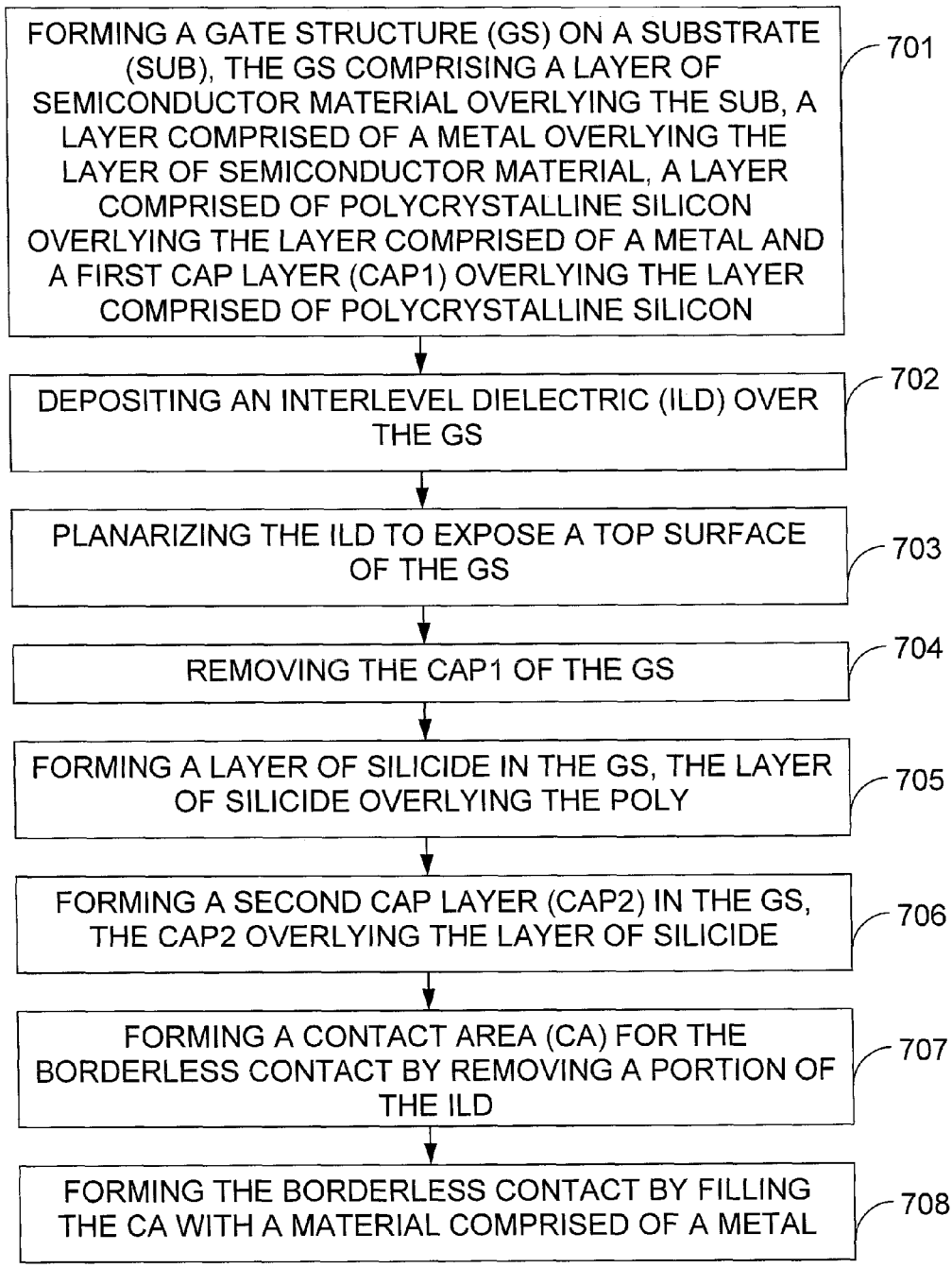
FIG. 34 depicts a flowchart illustrating another non-limiting example of a method for practicing the exemplary embodiments of this invention.

(3A) In another exemplary embodiment, and as shown in FIG. 34, a method (e.g., to fabricate a semiconductor device having a borderless contact) comprising: forming a gate structure (GS) on a substrate (SUB), the gate structure comprising a layer of semiconductor material overlying the substrate, a layer comprised of a metal overlying the layer of semiconductor material, a layer comprised of polycrystalline silicon overlying the layer comprised of a metal and a first cap layer (CAP1) overlying the layer comprised of polycrystalline silicon (701); depositing an interlevel dielectric (ILD) over the gate structure (702); planarizing the interlevel dielectric to expose a top surface of the gate structure (703); removing the first cap layer of the gate structure (704); forming a layer of silicide in the gate structure, the layer of silicide overlying the layer comprised of polycrystalline silicon (705); forming a second cap layer (CAP2) in the gate structure, the second cap layer overlying the layer of silicide (706); forming a contact area (CA) for the borderless contact by removing a portion of the interlevel dielectric (707); and forming the borderless contact by filling the contact area with a material comprised of a metal (708).

A method as above, where the interlevel dielectric comprises an oxide with a nitride liner. A method as in any above, where the second cap layer comprises a nitride. A method as in any above, where the borderless contact is disposed between the gate structure and another gate structure. A method as in any above, where forming the contact area for the borderless contact comprises using a contact mask and a contact reactive ion etch to remove the portion of the interlevel dielectric, where an opening on the contact mask is wider than a space between the gate structure and the other gate structure. A method as in any above, further comprising one or more additional aspects of the exemplary embodiments of the invention as described herein.

(3B) In a further exemplary embodiment, a semiconductor device comprising: a substrate; and a gate structure on the substrate, the gate structure comprising a layer of semiconductor material overlying the substrate, a layer comprised of a metal overlying the layer of semiconductor material, a layer comprised of polycrystalline silicon overlying the layer comprised of a metal, a layer of silicide overlying the layer comprised of polycrystalline silicon and a cap layer overlying the layer of silicide.

The semiconductor device as above, where the cap layer comprises a nitride. The semiconductor device as in any above, further comprising: an interlevel dielectric that at least partially overlies the gate structure; and a borderless contact comprised of a metal. The semiconductor device as in any above, where the interlevel dielectric comprises an oxide with a nitride liner. The semiconductor device as in any above, where the semiconductor device comprises a metal oxide semiconductor field effect transistor. The semiconductor device as in any above, further comprising one or more additional aspects of the exemplary embodiments of the invention as described herein.

Figure 35:
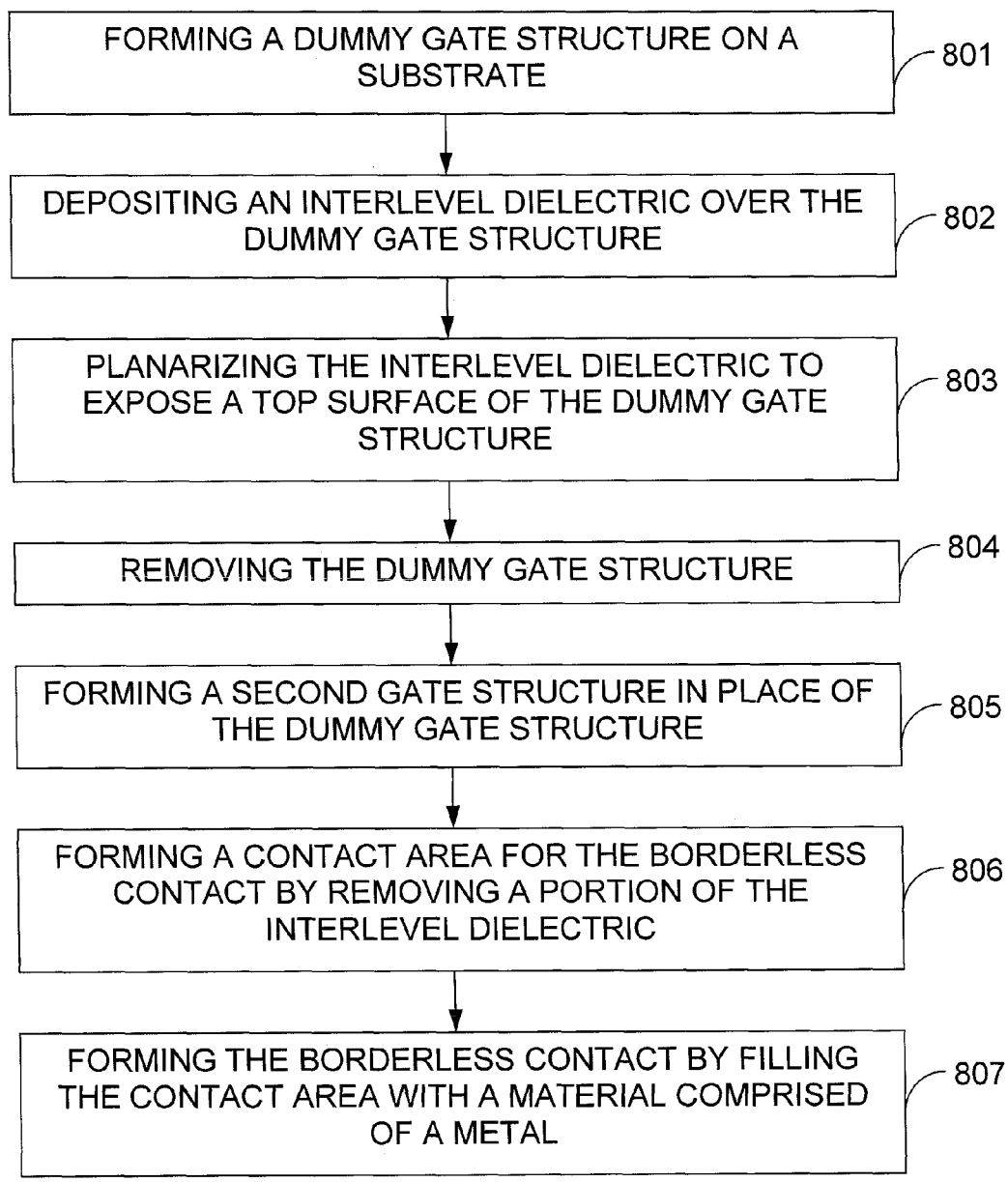
FIG. 35 shows a flowchart illustrating another non-limiting example of a method for practicing the exemplary embodiments of this invention.

(4A) In another exemplary embodiment, and as shown in FIG. 35, a method (e.g., to fabricate a semiconductor device having a borderless contact) comprising: forming a dummy gate structure on a substrate (801); depositing an interlevel dielectric over the dummy gate structure (802); planarizing the interlevel dielectric to expose a top surface of the dummy gate structure (803); removing the dummy gate structure (804); forming a second gate structure in place of the dummy gate structure (805); forming a contact area for the borderless contact by removing a portion of the interlevel dielectric (806); and forming the borderless contact by filling the contact area with a material comprised of a metal (807).

A method as above, where forming the second gate structure in place of the dummy gate structure comprises: depositing a layer of dielectric material; depositing a material comprised of a metal; planarizing and recessing the material comprised of a metal to form a metal gate core in the second gate structure that is adjacent to the layer of dielectric material on at least two surfaces of the metal gate core; and forming a cap layer overlying the layer of dielectric material and the metal gate core. A method as in any above, where a top surface of the metal gate core is not covered by the layer of dielectric material. A method as in any above, where the at least two surfaces comprise at least one sidewall surface and a bottom surface. A method as in any above, where the at least two surfaces does not comprise a top surface of the metal gate core. A method as in any above, further comprising one or more additional aspects of the exemplary embodiments of the invention as described herein.

(4B) In a further exemplary embodiment, a semiconductor device comprising: a substrate; a gate structure on the substrate, the gate structure comprising a metal gate core that is adjacent to a layer of dielectric material on at least two surfaces of the metal gate core; and a cap layer overlying the layer of dielectric material and the metal gate core.

The semiconductor device as in any above, where a top surface of the metal gate core is not covered by the layer of dielectric material. The semiconductor device as in any above, where the at least two surfaces comprise at least one sidewall surface and a bottom surface.

The semiconductor device as in any above, where the at least two surfaces do not comprise a top surface of the metal gate core. The semiconductor device as in any above, further comprising: an interlevel dielectric that at least partially overlies the gate structure; and a borderless contact comprised of a metal. The semiconductor device as in any above, further comprising one or more additional aspects of the exemplary embodiments of the invention as described herein.

Figure 36:
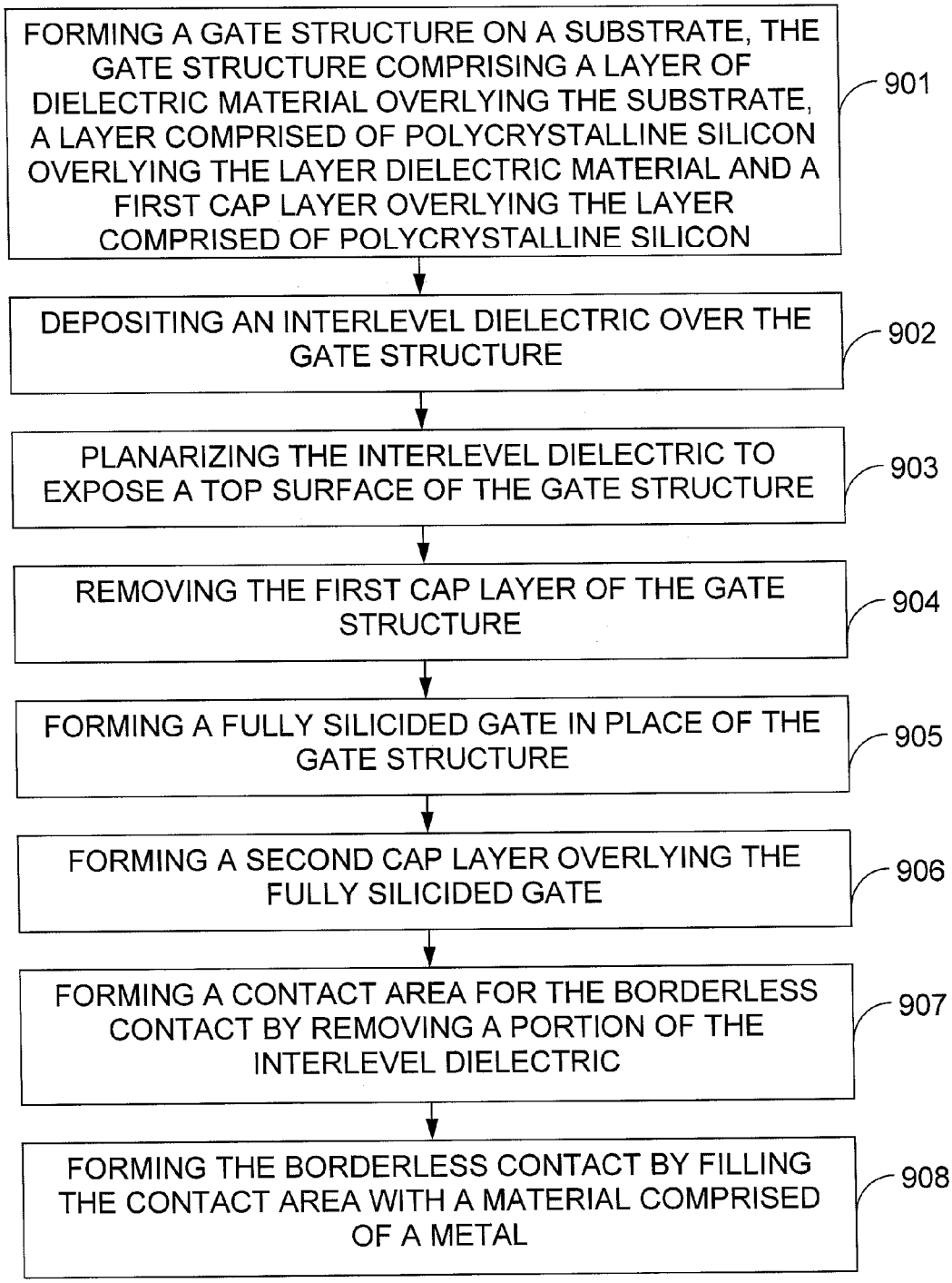
FIG. 36 depicts a flowchart illustrating another non-limiting example of a method for practicing the exemplary embodiments of this invention.

(5) In another exemplary embodiment, and as shown in FIG. 36, a method (e.g., to fabricate a semiconductor device having a borderless contact) comprising: forming a gate structure on a substrate, the gate structure comprising a layer of dielectric material overlying the substrate, a layer comprised of polycrystalline silicon overlying the layer dielectric material and a first cap layer overlying the layer comprised of polycrystalline silicon (901); depositing an interlevel dielectric over the gate structure (902); planarizing the interlevel dielectric to expose a top surface of the gate structure (903); removing the first cap layer of the gate structure (904); forming a fully silicided gate in place of the gate structure (905); forming a second cap layer overlying the fully silicided gate (906); forming a contact area for the borderless contact by removing a portion of the interlevel dielectric (907); and forming the borderless contact by filling the contact area with a material comprised of a metal (908).

A method as in any above, further comprising one or more additional aspects of the exemplary embodiments of the invention as described herein.

The blocks shown in FIGS. 32-36 further may be considered to correspond to one or more functions and/or operations that are performed in conjunction with one or more components, circuits, chips, apparatus, processors, computer programs and/or function blocks. Any and/or all of the above may be implemented in any practicable solution or arrangement that enables operation in accordance with the exemplary embodiments of the invention as described herein.

In addition, the arrangement of the blocks depicted in FIGS. 32-36 should be considered merely exemplary and non-limiting. It should be appreciated that the blocks shown in FIGS. 32-36 may correspond to one or more functions and/or operations that may be performed in any order (e.g., any suitable, practicable and/or feasible order) and/or concurrently (e.g., as suitable, practicable and/or feasible) so as to implement one or more of the exemplary embodiments of the invention. In addition, one or more additional functions, operations and/or steps may be utilized in conjunction with those shown in FIGS. 32-36 so as to implement one or more further exemplary embodiments of the invention.

That is, the exemplary embodiments of the invention shown in FIGS. 32-36 may be utilized, implemented or practiced in conjunction with one or more further aspects in any combination (e.g., any combination that is suitable, practicable and/or feasible) and are not limited only to the steps, blocks, operations and/or functions shown in FIGS. 32-36.

The flowchart and block diagrams in FIGS. 32-36 illustrate the architecture, functionality, and operation of possible exemplary implementations of systems, methods and products according to various exemplary embodiments of the invention. In this regard, each block in the flowchart or block diagrams may represent a module, segment or portion of code, which comprises one or more executable instructions for implementing the specified (logical) function(s). It should also be noted that, in some alternative exemplary implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The exemplary methods and techniques described herein may be used in the fabrication of integrated circuit chips. The resulting integrated circuit chips can be distributed by the fabricator in raw wafer form (i.e., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). The chip is then integrated with other chips, discrete circuit elements and/or other signal processing devices as part of either (a) an intermediate product, such as a motherboard, or (b) an end product. The end product can be any product that includes integrated circuit chips, ranging from toys and other low-end applications to advanced computer products having numerous components, such as a display, a keyboard or other input device and/or a central processor, as non-limiting examples.

The terminology used herein is for the purpose of describing particular exemplary embodiments only and is not intended to be limiting of the exemplary embodiments of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements and/or components, but do not preclude the presence or addition of one or more other features, integers, steps, operations, elements, components and/or groups thereof.

Unless described otherwise herein, "depositing" may include any now known or later developed techniques appropriate for the material to be deposited, including, but not limited to: CVD, LPCVD, PECVD, semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic level deposition (ALD), chemical oxidation, molecular beam epitaxy (MBE), plating or evaporation. Any references to "poly" or "poly silicon" should be understood to refer to polycrystalline silicon.

Any use of the terms "connected," "coupled" or variants thereof should be interpreted to indicate any such connection or coupling, direct or indirect, between the identified elements. As a non-limiting example, one or more intermediate elements may be present between the "coupled" elements. The connection or coupling between the identified elements may be, as non-limiting examples, physical, electrical, magnetic, logical or any suitable combination thereof in accordance with the described exemplary embodiments. As non-limiting examples, the connection or coupling may comprise one or more printed electrical connections, wires, cables, mediums or any suitable combination thereof.

Generally, various exemplary embodiments of the invention can be implemented in different mediums, such as software, hardware, logic, special purpose circuits or any combination thereof. As a non-limiting example, some aspects may be implemented in software which may be run on a computing device, while other aspects may be implemented in hardware.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. However, all such and similar modifications will still fall within the scope of the teachings of the exemplary embodiments of the invention.

Furthermore, some of the features of the preferred embodiments of this invention could be used to advantage without the corresponding use of other features. As such, the foregoing description should be considered as merely illustrative of the principles of the invention, and not in limitation thereof.

What is claimed is:

1. A semiconductor device comprising:
   a substrate;
   a borderless contact comprised of a metal;
   a gate structure on the substrate;
   a first spacer disposed between the gate structure and the borderless contact and comprised of a first spacer material;
   an interlevel dielectric that at least partially overlies the gate structure;
   a second spacer disposed between at least a portion of the gate structure and the interlevel dielectric and comprised of a second spacer material that is different from the first spacer material, where the first spacer and the second spacer are on different sides of the gate structure, where the second spacer comprises a nitride and the first spacer comprises a low-K dielectric material; and
   a third spacer between the interlevel dielectric and the borderless contact, where the third spacer is spaced from the first spacer and comprises a low-K dielectric material,
   wherein the third spacer is comprised of the same first spacer material as the first spacer.

2. The semiconductor device of claim 1, further comprising a fourth spacer disposed between the gate structure and the first spacer, where the fourth spacer comprises an inner spacer and the first spacer comprises an outer spacer.

3. The semiconductor device of claim 1, where the semiconductor device comprises a metal oxide semiconductor field effect transistor.

4. The semiconductor device of claim 1, where the first spacer and the second spacer are on opposite sides of the gate structure.

5. The semiconductor device of claim 1, where the first spacer and the second spacer have a different thickness relative to each other.

6. The semiconductor device of claim 5, where the first spacer is thinner than the second spacer.

7. The semiconductor device of claim 4, where the first spacer is thinner than the second spacer.

8. The semiconductor device of claim 1, where the borderless contact contacts the gate structure between the first and third spacers.

9. The semiconductor device of claim 1, where the borderless contact separates the first and third spacers from each other.

10. The semiconductor device of claim 1, where low-K dielectric material of the first spacer is the same material as the low-K dielectric material of the third spacer.

* * * * *